(12) United States Patent
Jung

(10) Patent No.: US 10,957,749 B2
(45) Date of Patent: Mar. 23, 2021

(54) DISPLAY DEVICE INCLUDING PHOTO PIXEL WITH IMPROVED SENSING SENSITIVITY

(71) Applicant: Samsung Display Co., Ltd., Yongin-Si (KR)

(72) Inventor: Keumdong Jung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/010,907

(22) Filed: Jun. 18, 2018

(65) Prior Publication Data

US 2019/0043420 A1   Feb. 7, 2019

(30) Foreign Application Priority Data

Aug. 4, 2017   (KR) .................. 10-2017-0099204

(51) Int. Cl.
| | |
|---|---|
| G09G 5/00 | (2006.01) |
| H01L 27/32 | (2006.01) |
| G09G 3/3225 | (2016.01) |
| G06K 9/00 | (2006.01) |
| G06F 3/044 | (2006.01) |
| H01L 51/00 | (2006.01) |

(52) U.S. Cl.
CPC ........ *H01L 27/3234* (2013.01); *G06K 9/0004* (2013.01); *G09G 3/3225* (2013.01); *G06F 3/044* (2013.01); *G09G 2360/14* (2013.01); *H01L 27/323* (2013.01); *H01L 27/3246* (2013.01); *H01L 51/0097* (2013.01)

(58) Field of Classification Search
CPC .... G09G 3/3225; G06F 3/044; G09F 2360/14

USPC .................................................... 345/206
See application file for complete search history.

(56) References Cited

U.S. PATENT DOCUMENTS

| | | |
|---|---|---|
| 6,693,441 B2 | 2/2004 | Lane et al. |
| 7,030,860 B1 | 4/2006 | Hsu et al. |
| 7,616,786 B2 | 11/2009 | Setlak |
| 7,915,649 B2 | 3/2011 | Im et al. |

(Continued)

FOREIGN PATENT DOCUMENTS

| | | |
|---|---|---|
| KR | 1020130021214 A | 3/2013 |
| KR | 101333783 B1 | 11/2013 |

(Continued)

*Primary Examiner* — Jonathan M Blancha
(74) *Attorney, Agent, or Firm* — Cantor Colburn LLP

(57) ABSTRACT

A display device includes a substrate, a driving layer which is disposed on the substrate, and includes first driving circuit groups each including N first pixel driving circuits and photo pixels each including a photo driving circuit and a photo sensor electrically connected to the photo driving circuit. A display element layer is on the driving layer, and includes first display element groups each including N first display elements electrically connected to the respective N first pixel driving circuits. Minimum distances between first color display elements included in the first display elements in a first predetermined direction in a plan view, are substantially the same. A distance between two first pixel driving circuits adjacent to each other in a second predetermined direction with the photo pixel therebetween in the plan view is different from a distance between two first pixel driving circuits continuously disposed in the second predetermined direction.

15 Claims, 17 Drawing Sheets

(56) References Cited

U.S. PATENT DOCUMENTS

| | | | |
|---|---|---|---|
| 8,325,155 B2* | 12/2012 | Chang et al. | G06F 3/0412 |
| | | | 345/175 |
| 8,497,535 B2 | 7/2013 | Lee et al. | |
| 8,531,099 B2 | 9/2013 | Koh | |
| 8,867,799 B2 | 10/2014 | Benkley, III | |
| 8,917,387 B1 | 12/2014 | Lee et al. | |
| 8,933,868 B2 | 1/2015 | Choi | |
| 8,965,449 B2 | 2/2015 | Alvarez Rivera et al. | |
| 8,976,305 B2 | 3/2015 | Kim et al. | |
| 9,030,440 B2 | 5/2015 | Pope et al. | |
| 9,287,436 B2 | 3/2016 | Han et al. | |
| 9,310,940 B2 | 4/2016 | Brosnan | |
| 9,336,428 B2 | 5/2016 | Erhart | |
| 9,666,123 B2 | 5/2017 | Pak | |
| 9,836,165 B2 | 12/2017 | Nho et al. | |
| 2005/0258351 A1* | 11/2005 | Ma | H01L 27/14625 |
| | | | 250/239 |
| 2007/0200814 A1* | 8/2007 | Kwon | G09G 3/2022 |
| | | | 345/92 |
| 2009/0166065 A1* | 7/2009 | Clayton | H05K 1/189 |
| | | | 174/254 |
| 2010/0134735 A1 | 6/2010 | Nakamura et al. | |
| 2011/0032398 A1* | 2/2011 | Lenchenkov | H01L 27/14621 |
| | | | 348/294 |
| 2011/0057908 A1* | 3/2011 | Park | G06F 3/0412 |
| | | | 345/176 |
| 2012/0236223 A1* | 9/2012 | Chen | G02F 1/13338 |
| | | | 349/42 |
| 2013/0057528 A1* | 3/2013 | Tanaka | G06F 3/0412 |
| | | | 345/207 |
| 2013/0314377 A1 | 11/2013 | Los | |
| 2015/0035798 A1* | 2/2015 | Zhou | G09G 3/3266 |
| | | | 345/174 |
| 2015/0162391 A1* | 6/2015 | Kim | H01L 27/3218 |
| | | | 257/40 |
| 2015/0242040 A1* | 8/2015 | Gu et al. | G06F 3/0416 |
| | | | 345/175 |
| 2015/0331508 A1 | 11/2015 | Nho et al. | |
| 2016/0103359 A1 | 4/2016 | Kimura et al. | |
| 2016/0161332 A1 | 6/2016 | Townsend | |
| 2016/0179229 A1* | 6/2016 | Ahn | G06F 3/041 |
| | | | 345/173 |
| 2016/0358543 A1 | 12/2016 | Rappoport et al. | |
| 2017/0017824 A1 | 1/2017 | Smith et al. | |
| 2017/0076671 A1* | 3/2017 | Kim et al. | G09G 3/3258 |
| | | | 345/691 |
| 2017/0194411 A1 | 7/2017 | Park et al. | |
| 2017/0270342 A1* | 9/2017 | He | G06F 3/0412 |
| 2017/0277310 A1* | 9/2017 | Xiong | G06F 3/044 |
| 2017/0288001 A1* | 10/2017 | Ito | H01L 27/3272 |
| 2017/0289805 A1* | 10/2017 | Hong | G09G 3/3233 |
| 2017/0344787 A1* | 11/2017 | Cho | G06F 3/0416 |
| 2017/0345152 A1 | 11/2017 | Han et al. | |

FOREIGN PATENT DOCUMENTS

| | | |
|---|---|---|
| KR | 1020140107901 A | 9/2014 |
| KR | 1020160007590 A | 1/2016 |
| KR | 1020170002072 A | 1/2017 |
| KR | 101717232 B1 | 3/2017 |
| KR | 1020170134932 A | 12/2017 |
| KR | 1020180061482 A | 6/2018 |
| KR | 1020180092003 A | 8/2018 |
| KR | 1020190011868 A | 2/2019 |

* cited by examiner

DISPLAY DEVICE INCLUDING PHOTO PIXEL WITH IMPROVED SENSING SENSITIVITY

This application claims priority to Korean Patent Application No. 10-2017-0099204, filed on Aug. 4, 2017, and all the benefits accruing therefrom under 35 U.S.C. § 119, the content of which in its entirety is herein incorporated by reference.

BACKGROUND

1. Field

Exemplary embodiments of the invention relate to a display device, and more particularly to a display device including a light sensing area.

2. Description of the Related Art

Recently, display devices have a function for sensing user's fingerprints. Examples of a fingerprint recognition method include an electrostatic capacity type based on a change in capacitance of a capacitor formed between electrodes, an optical type using an optical sensor, and an ultrasonic type using a piezoelectric body.

SUMMARY

In an optical type using an optical sensor, a separate modular optical sensor is disposed (e.g., mounted) in a display device, so that it raises costs while sensitivity does not reach a level at which a fingerprint of a user is sensed.

Exemplary embodiments of the invention provide a display device including a photo pixel with improved sensing sensitivity built in a driving layer of a display panel.

Exemplary embodiments of the invention also provide a display device that does not change the arrangement structure of display elements even when photo pixel areas are provided in a light sensing area and thus maintains a constant resolution in a display area regardless of the area.

An exemplary embodiment of the invention provides a display device includes a substrate, a driving layer, and a display element layer. The driving layer is disposed on the substrate, and includes first driving circuit groups each including N first pixel driving circuits and photo pixels. N is a natural number and each of the photo pixels includes a photo driving circuit and a photo sensor electrically connected to the photo driving circuit. The display element layer is disposed on the driving layer, and includes first display element groups each including N first display elements electrically connected to the respective N first pixel driving circuits. Minimum distances between first color display elements included in the N first display elements, which are measured in a first predetermined direction in a plan view, are substantially the same. A distance between two first pixel driving circuits of the N first pixel driving circuits adjacent to each other in a second predetermined direction with a photo pixel of the photo pixels therebetween in the plan view is different from a distance between two first pixel driving circuits of the N first pixel driving circuits continuously disposed in the second predetermined direction.

In an exemplary embodiment, the each driving layer may further include second driving circuit groups including N second pixel driving circuits, where the each display element layer may further include N second display elements electrically connected to the N second pixel driving circuits, where minimum distances between first color display elements included in the N second display elements, which are measured in the first predetermined direction in the plan view, may be substantially the same, where distances between adjacent two second pixel driving circuits of the N second pixel driving circuits, which are measured in the second predetermined direction in the plan view, may be substantially the same.

In an exemplary embodiment, a display area where an image may be displayed and a non-display area adjacent to the display area are defined on the display device, where the display area may include a normal display area and a light sensing area which senses a user's input by an incident light, where the first driving circuit groups and the first display element groups may be disposed in the light sensing area in the plan view, where the second driving circuit groups and the second display element groups may be disposed in the normal display area in the plan view.

In an exemplary embodiment, an area that each of the first driving circuit groups and each of the second driving circuit groups occupies may be substantially the same, where an area that each of the first display element groups and each of the second display element groups occupies may be substantially the same.

In an exemplary embodiment, an area that each of the N first pixel driving circuits may be smaller than an area that each of the N second pixel driving circuits occupies.

In an exemplary embodiment, a first driving circuit group among the first driving circuit groups and a second driving circuit group among the second driving circuit groups adjacent to the first driving circuit group in a first direction may be spaced apart from each other to define a vacant area.

In an exemplary embodiment, a distance between a first pixel driving circuit of the first driving circuit group adjacent to each other in the first direction and a second pixel driving circuit of the second driving circuit group may be greater than a distance between two first pixel driving circuits of the N first pixel driving circuits included in the respective first driving circuit groups and adjacent to each other in the first direction and a distance between two second pixel driving circuits of the N second pixel driving circuits included in the respective second driving circuit groups and adjacent to each other in the first direction.

In an exemplary embodiment, the driving layer may further include signal lines, where a predetermined number of the signal lines may have a bent shape in the vacant area.

In an exemplary embodiment, a predetermined number of the signal lines may be branched in the vacant area to be electrically connected to the N first pixel driving circuits and the photo driving circuit.

In an exemplary embodiment, the photo sensor may include a lower metal layer disposed on the substrate, an active layer disposed on the lower metal layer, an upper metal layer which is disposed on the active layer and in which an opening exposing a portion of the active layer is defined, an absorption filter which is disposed on the upper metal layer and covers the opening, and an interference filter which is disposed on the upper metal layer and covers the opening.

In an exemplary embodiment, the display element layer may include a pixel definition film which overlaps the photo sensor, and a lens which overlaps the photo sensor on the pixel definition film and includes the same material as that of the pixel definition film.

In an exemplary embodiment, a display area where an image is displayed and a non-display area adjacent to the display area may be defined on the display device, where the non-display area may include a first bending area defined outside a first side of the display area in a first direction, a first pad area defined outside the first bending area in the first direction, a second bending area defined outside a second side of the display area in the first direction, and a second pad area defined outside the second bending area in the first direction, where the substrate may be bent along a bending axis extending in a second direction intersecting the first direction in the first and second bending areas. The display device may further include a first driving circuit chip which provides a signal to the N first pixel driving circuits and the photo driving circuit and is disposed on the first pad area, and a second driving circuit chip which receives a signal sensed by the photo pixel and is disposed in the second pad area.

In an exemplary embodiment, the display device may further include a flexible printed circuit substrate which connects the first pad area and the second pad area of the display device to each other.

In an exemplary embodiment of the invention, a display device may include a substrate, a driving layer disposed on the substrate, and including first driving circuit groups each including a plurality of first pixel driving circuits and photo pixels and second driving circuit groups each including a plurality of second pixel driving circuits, and a display element layer disposed on the driving layer, and including a plurality of display elements electrically connected to the plurality of first pixel driving circuits and the plurality of second pixel driving circuits, where minimum distances between first color display elements included in the plurality of display elements, which are measured in a first predetermined direction in the plan view, are substantially the same, where a first driving circuit group among the first driving circuit groups and a second driving circuit group among the second driving circuit groups adjacent to the first driving circuit group in a first direction are spaced apart from each other.

In an exemplary embodiment, a distance between a first pixel driving circuit of the first driving circuit group adjacent to each other in the first direction and a second pixel driving circuit of the second driving circuit group may be greater than a distance between two first pixel driving circuits of the plurality of first pixel driving circuits included in the respective first driving circuit groups and adjacent to each other in the first direction and a distance between two second pixel driving circuits of the plurality of second pixel driving circuits included in the respective second driving circuit groups and adjacent to each other in the first direction.

In an exemplary embodiment of the invention, a display device includes a first scanning line which receives a first scanning signal, a second scanning line which receives a second scanning signal different from the first scanning signal, a sensing line which is insulated from the first and second scanning lines, a display element which receives the first and second scanning lines from the first and second scanning signals and emit light, and a photo pixel which receives the first and second scanning signals from the first and second scanning lines and provide a current to the sensing line based on a light reflected by a user among the light emitted from the display element.

In an exemplary embodiment, the photo pixel may include a photo sensor including a cathode and an anode which receive a power voltage, a first transistor including a gate terminal connected to the second scanning line, a first terminal connected to the anode of the photo sensor, and a second terminal connected to the sensing line, and a second transistor including a gate terminal connected to the first scanning line, a first terminal which receives an initialization voltage lower than the power voltage, and a second terminal connected to the anode of the photo sensor.

In an exemplary embodiment, the photo pixel may include a photo sensor including a cathode and an anode which receive a power voltage, a first transistor including a gate terminal connected to the second scanning line, a first terminal, and a second terminal connected to the sensing line, a second transistor including a gate terminal connected to the first scanning line, a first terminal which receives an initialization voltage lower than the power voltage, and a second terminal connected to the anode of the photo sensor, and a third transistor including a gate terminal connected to the anode of the photo sensor, a first terminal which receives the power voltage, and a second terminal connected to the first terminal of the first transistor.

In an exemplary embodiment, the photo pixel may include a photo sensor including an anode and a cathode which receive an initialization voltage, a first transistor including a gate terminal connected to the second scanning line, a first e terminal connected to the cathode of the photo sensor, and a second terminal connected to the sensing line, and a second transistor including a gate terminal connected to the first scanning line, a first terminal which receives a power voltage higher than the initialization voltage, and a second terminal connected to the cathode of the photo sensor.

In an exemplary embodiment, the photo pixel may include a photo sensor including an anode and a cathode which receive an initialization voltage, a first transistor including a gate terminal connected to the second scanning line, a first terminal, and a second terminal connected to the sensing line, a second transistor including a gate terminal connected to the first scanning line, a first terminal which receives a power voltage higher than the initialization voltage, and a second terminal connected to the cathode of the photo sensor, and a third transistor including a gate terminal connected to the cathode of the photo sensor, a first terminal which receives the power voltage, and a second terminal connected to the first terminal of the first transistor.

In an exemplary embodiment, the photo pixel may include a photo sensor including an anode and a cathode which receive an initialization voltage, a first transistor including a gate terminal connected to the cathode of the photo sensor, a first terminal, and a second terminal, a second transistor including a gate terminal connected to the second scanning line, a first terminal connected to the second terminal of the first transistor, and a second terminal connected to the sensing line, a third transistor including a gate terminal connected to the first scanning line, a first terminal connected to the cathode of the photo sensor, and a second terminal connected to the first terminal of the first transistor, a fourth transistor including a gate terminal connected to the first scanning line, a first terminal which receives a power voltage higher than the initialization voltage, and a second terminal connected to the first terminal of the second transistor, and a fifth transistor including a gate terminal connected to the second scanning line, a first terminal which receives the power voltage, and a second terminal connected to the first terminal of the first transistor.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
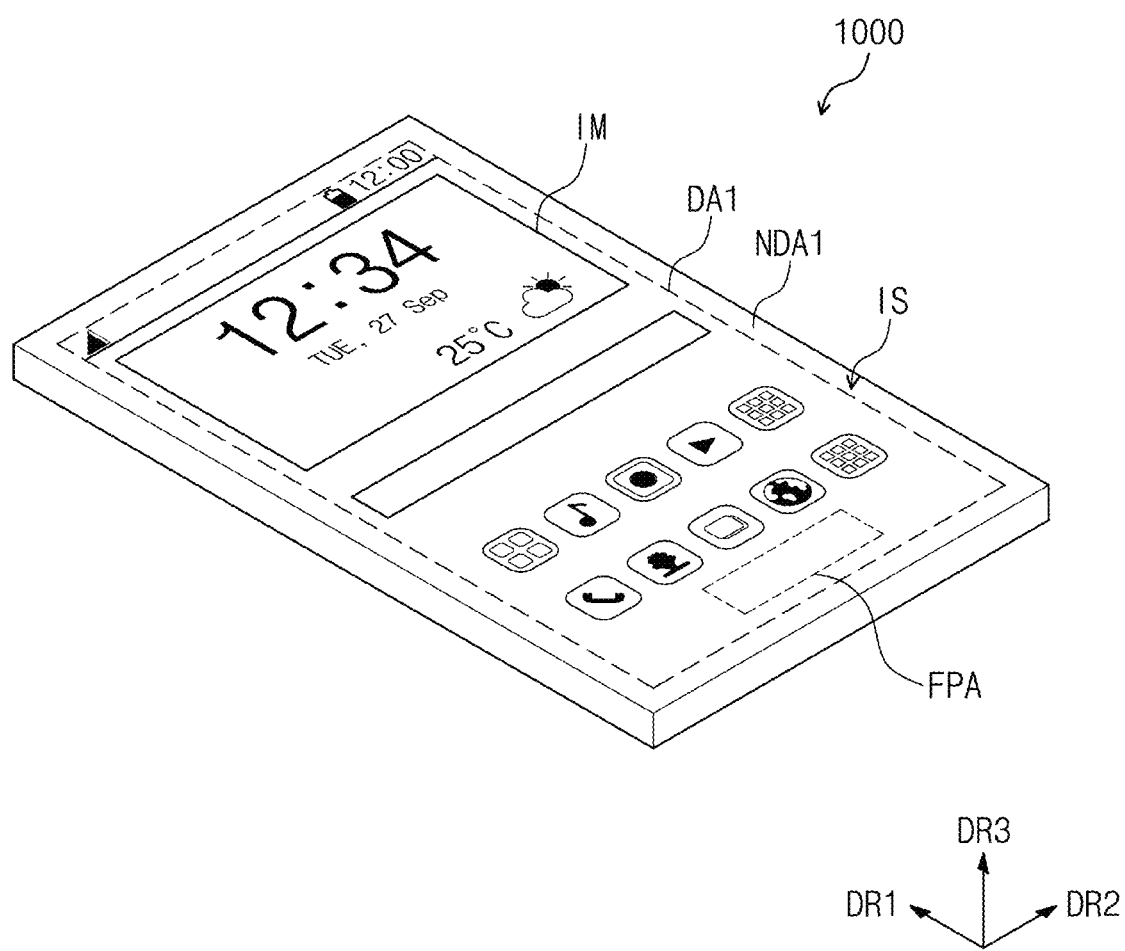
FIG. 1 is a perspective view of an exemplary embodiment of a display device according to the invention.

Hereinafter, another exemplary embodiment of the invention will be described with reference to the drawings. In this specification, when it is mentioned that a component (or, an area, a layer, a part, etc.) is referred to as being "on", "connected to" or "combined to" another component, this means that the component may be directly on, connected to, or combined to the other component or a third component therebetween may be present.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the invention. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a perspective view of a display device according to an exemplary embodiment of the invention.

Referring to FIG. 1, a display area DA1 where an image is displayed and a non-display area NDA1 adjacent to the display area DA1 are defined on a display surface IS of a display device 1000. A plurality of pixels PX (refer to FIG. 2) may be disposed in the display area DA1. The non-display area NDA1 is an area where no image is displayed. The display surface IS of the display device 1000 may be the outermost surface of the display device 1000 and may be a surface that a user views. FIG. 1 exemplarily shows that the display area DA1 has a rectangular form and the non-display area NDA surrounds the display area DA1. However, the invention is not limited thereto, and the display area DA1 and the non-display area NDA1 may have various shapes.

As shown in FIG. 1, the display surface IS where the image IM is displayed is parallel to the plane defined by a first direction DR1 and a second direction DR2. The normal direction of the display surface IS, that is, a thickness direction of the display device DD, indicates a third direction DR3. The front surface (or an upper surface) and the rear surface (or a lower surface) of each member may be defined by the third direction DR3. However, the directions that the first to third directions DR1, DR2, and DR3 indicate may be converted to other directions as a relative concept.

The display device 1000 may sense the user's touch inputted to the display area DA1. The display device 1000 may include a touch panel capable of sensing the user's touch inputted to the display area DA1.

A light sensing area FPA may be further defined on the display surface IS of the display device 1000. The display device 1000 may sense the light inputted to the light sensing area FPA to sense the user's input. The light sensing area FPA may measure the heart rate by sensing the minute movement of the user's fingerprint or the user's finger. The display device 1000 may include a photo pixel HX (refer to FIG. 2) disposed in the light sensing area FPA. Details will be described later.

FIG. 1 exemplarily shows that the light sensing area FPA is defined in the display area DA1. However, the invention is not limited thereto. In an exemplary embodiment, the light sensing area FPA may be defined in the non-display area NDA1 and may be defined to overlap both the display area DA1 and the non-display area NDA1, for example.

Figure 2:
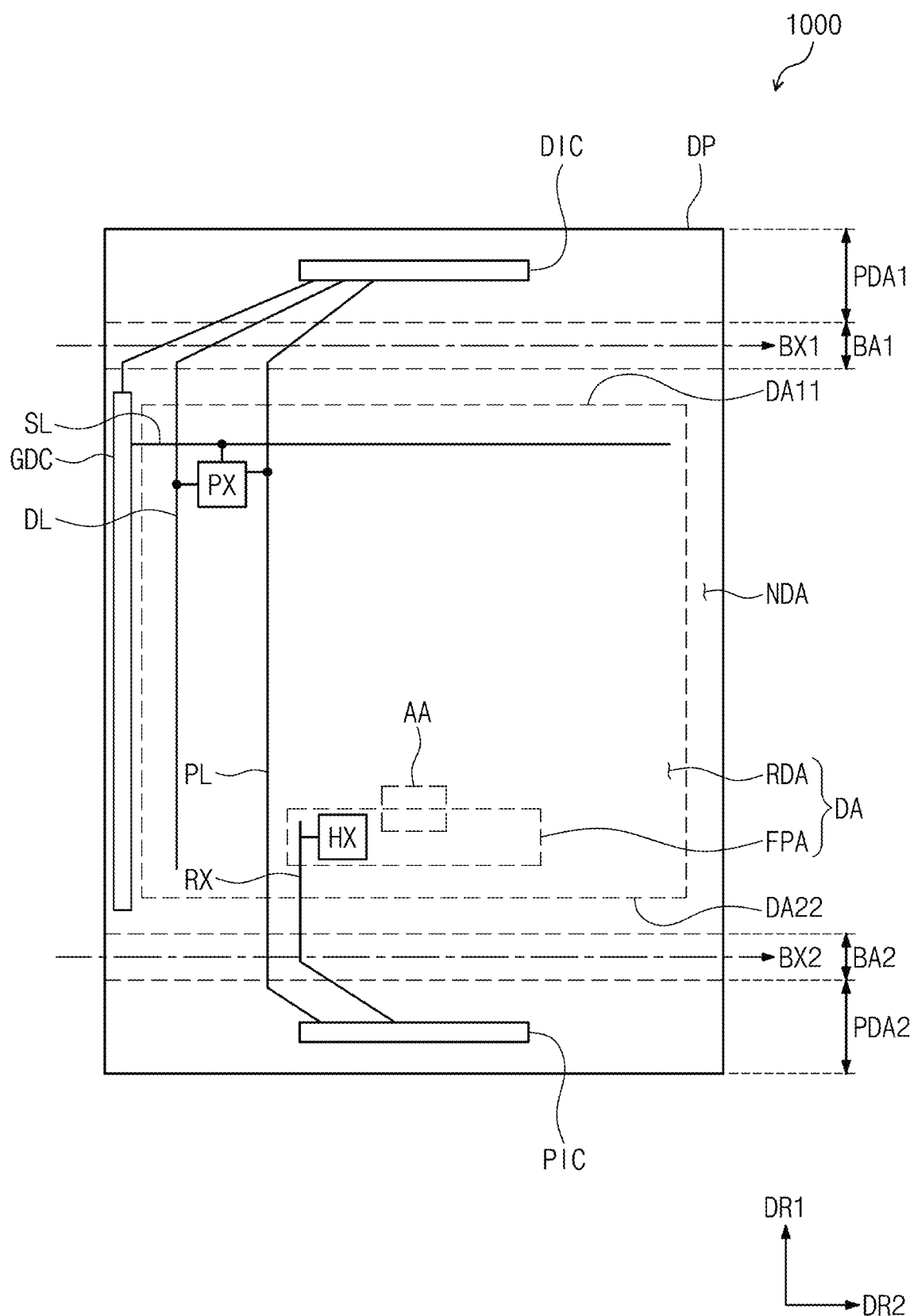
FIG. 2 is a plan view of a display device of FIG. 1.
Figure 3:
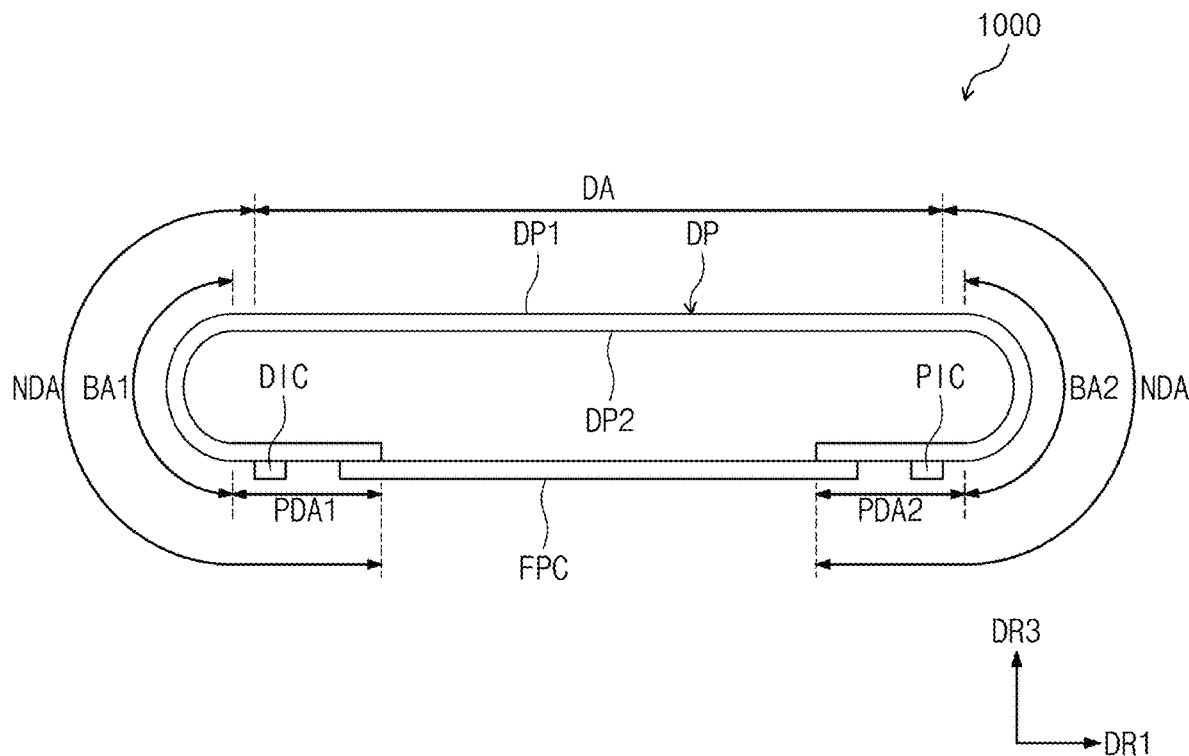
FIG. 3 is a side view of a display device of FIG. 1.

FIG. 2 is a plan view of the display device of FIG. 1, and FIG. 3 is a side view of the display device of FIG. 1.

Referring to FIGS. 2 and 3, the display device 1000 may include a display panel DP, a first driving circuit chip DIC, a second driving circuit chip PIC, and a flexible printed circuit substrate FPC.

The display panel DP may be a light-emitting display panel, and is not particularly limited. In an exemplary embodiment, the display panel DP may be an organic light emitting display panel or a quantum dot light emitting display panel, for example. In the organic light emitting display panel, the emission layer includes an organic light emitting material. In relation to the quantum dot light emitting display panel, an emission layer includes quantum dots and quantum rods. Hereinafter, the display panel DP is described as an organic light emitting display panel.

The display panel DP may include a display area DA and a non-display area NDA adjacent to the display area DA in the plan view. The display panel DP may display an image in the display area DA and may not display an image in the non-display area NDA. The display area DA and the non-display area NDA shown in FIG. 2 correspond to the display area DA1 and the non-display area NDA1 shown in FIG. 1, respectively. However, the display area DA and the non-display area NDA of the display panel DP may not be necessarily identical to the display area DA1 and the non-display area NDA1 of the display device 1000, and may vary according to a structure/design of the display panel DP.

The display area DA may include a light sensing area FPA and a normal display area RDA spaced apart from the light sensing area FPA. The light sensing area FPA and the normal display area RDA may have different circuit structures. Details will be described later.

The non-display area NDA may include a first bending area BA1, a second bending area BA2, and a first pad area PDA1, and a second pad area PDA2.

The first bending area BA1 is defined as an area across the display panel DP in a second direction DR2 and outside the one side of the display area DA in a first direction DR1 in the plan view. The first pad area PDA1 is defined outside the first bending area BA1 in the first direction DR1 in the plan view. The display panel DP may be bent along a first bending axis BX1 extending in the second direction DR2 within the first bending area BA1. As the first bending area BA1 is bent from the upper surface DP1 of the display panel DP to the direction of the lower surface DP2 (a direction opposite to the third direction DR3), the first pad area PDA1 of the display panel DP is disposed below the display area DA.

The second bending area BA2 may be an area across the display panel DP in the second direction DR2 outside the other side of the display area DA which is opposite to the one side of the display area DA in the first direction DR1 in the plan view. The second pad area PDA2 is defined outside the second bending area BA2 in the first direction DR1 in the plan view. The display panel DP may be bent along a second bending axis BX2 extending in the second direction DR2 within the second bending area BA2. As the second bending area BA2 is bent from the upper surface DP1 of the display panel DP to the direction of the lower surface DP2 (a direction opposite to the third direction DR3), the second pad area PDA2 of the display panel DP is disposed below the display area DA.

The display panel DP may include a pixel PX, a photo pixel HX, a plurality of signal lines, and a scanning driving circuit GDC.

The pixel PX is disposed in the display area DA to display an image. The photo pixel HX may be disposed in the light sensing area FPA and receive the reflected light by a user to sense the user's input.

The signal lines may include a scanning line SL, a data line DL, a power line PL, and a sensing line RX. A plurality of scanning lines SL, a plurality of data lines DL, and a plurality of power lines PL are provided, but respective ones of the signals are illustrated in FIG. 2 for convenience.

The scanning line SL, the data line DL, and the power line PL are connected to the pixel PX. The data line DL and the power line PL may be connected to the first driving circuit chip DIC to receive a driving signal.

The photo pixel FIX may be connected to the sensing line RX. The photo pixel FIX may be connected to the scanning line SL and the power line PL to which the corresponding pixel is connected. Details will be described later. The sensing line RX may be connected to the second driving circuit chip PIC.

The scanning driving circuit GDC may be disposed in the non-display area NDA. The scanning driving circuit GDC may generate a scanning signal and output the generated scanning signal to the scanning line SL.

In an exemplary embodiment, the scanning driving circuit GDC may include a plurality of thin film transistors ("TFTs") provided through the same process as the driving circuit of the pixels PX, for example, a low temperature polycrystalline silicon ("LTPS") process or a low temperature polycrystalline oxide ("LTPO") process, for example. However, the invention is not limited thereto, and the plurality of TFTs may be provided by various other processes.

The first driving circuit chip DIC may be disposed in the first pad area PDA1. The first driving circuit chip DIC may be directly disposed (e.g., mounted) on the first pad area PDA1 but is not limited thereto, and may be disposed (e.g., mounted) on a flexible printed circuit substrate (not shown) connected to the first pad area PDA1. The first driving circuit chip DIC provides a signal necessary for driving the display panel DP. That is, the first driving circuit chip DIC may provide a signal to the data line DL and the power line PL. The first driving circuit chip DIC may be a source driver integrated circuit that provides a data signal to the data line DL.

The second driving circuit chip PIC may be disposed in the second pad area PDA2. The second driving circuit chip PIC may be directly disposed (e.g., mounted) on the second pad area PDA2 but is not limited thereto, and may be disposed (e.g., mounted) on a flexible printed circuit substrate (not shown) connected to the second pad area PDA2. The second driving circuit chip PIC may receive the signal sensed by the photo pixel HX through the sensing line RX and sense the user's input based on the received signal.

The light sensing area FPA may be defined to be closer to the other end DA22 of the display area DA, which is relatively closer to the second driving circuit chip PIC, than to the one end DA11 in the first direction DR1. Accordingly, the second driving circuit chip PIC is arranged in the second pad area PDA2 adjacent to the other end DA22 of the display area DA and this is advantageous to reduce the resistance value of the sensing line RX and improve the sensitivity of the photo pixel HX.

In an exemplary embodiment of the invention, even when the first and second driving circuit chips DIC and PIC are disposed in the first and second pad areas PDA1 and PDA2, respectively, since the first and second bending areas BA1 and BA2 are bent and both ends of the display panel DP which are opposite to each other in the first direction DR1 are bent downward, the area occupied by the non-display area ("NDA") in the plan view may be reduced.

The flexible printed circuit substrate FPC is connected to the first pad area PDA1 and the second pad area PDA2 of the display panel DP to provide a path through which the first and second driving circuit chips DIC and PIC exchange signals. Although FIGS. 2 and 3 exemplarily show that the flexible printed circuit substrate FPC is directly connected to the first pad area PDA1 and the second pad area PDA2, the invention is not limited thereto, and the flexible printed circuit substrate FPC may be connected to the first pad area PDA1 or the second pad area PDA2 through another flexible printed circuit substrate.

The second driving circuit chip PIC may receive a timing signal, a voltage signal, and so on desired for driving the photo pixel FIX through the flexible printed circuit substrate FPC and output the sensing result through the sensing line RX.

The second driving circuit chip PIC may be electrically connected to at least one of the data line DL and the power line PL. FIG. 2 exemplarily shows that the second driving circuit chip PIC is electrically connected to the power line PL. The second driving circuit chip PIC may receive a signal to be applied to the power line PL through the flexible printed circuit substrate FPC and may apply a signal necessary for the power line PL in addition to the first driving circuit chip DIC. Since the display panel DP is implemented in a large area, the length of wires passing through the display area DA may become long, and the brightness drop due to a RC delay difference may occur in the display area DA. It is possible to improve a difference in brightness that may occur at the both ends of the display area DA along the first direction DR1 as each of the first and second driving circuit chips DIC and PIC applies the same signal to the both ends of one of signal lines.

Although not shown in the drawing, in an exemplary embodiment, the flexible printed circuit substrate FPC may include a force driving chip. In the exemplary embodiment, the display panel may further include a force sensor disposed in the light sensing area FPA. The force driving chip may measure the intensity of the user's input applied to the light sensing area FPA based on the signal outputted from the force sensor.

Figure 4:
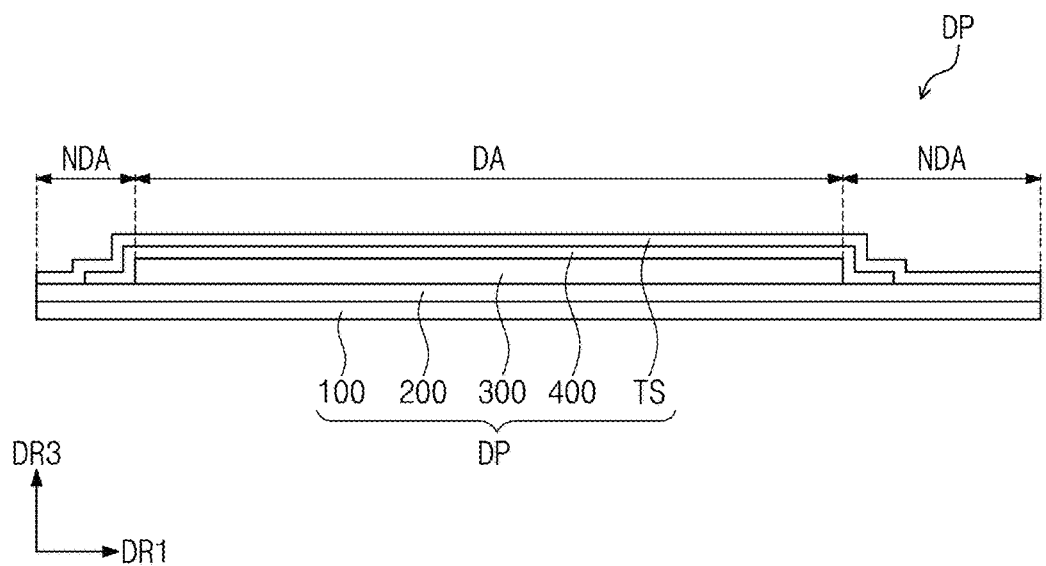
FIG. 4 is a cross-sectional view showing an exemplary embodiment of a display panel according to the invention.

FIG. 4 is a cross-sectional view showing a display panel according to an exemplary embodiment of the invention.

The display panel DP may include a substrate 100, a driving layer 200, a display element layer 300, and a sealing layer 400. Although not shown separately, the display panel DP may further include a protective member disposed below the substrate 100 and a window member disposed on the sealing layer 400. Further, the display panel DP may further include functional layers such as an antireflection layer, a refractive index control layer, and so on.

The substrate 100 may include at least one plastic film. The substrate 100 may include a flexible substrate, such as a plastic substrate, a glass substrate, a metal substrate, or an organic/inorganic composite substrate. The display area DA and the non-display area NDA described with reference to FIGS. 2 and 3 may be equally defined on the substrate 100.

The driving layer 200 is disposed on the substrate 100. The driving layer 200 includes at least one intermediate insulation layer and a circuit element. The intermediate insulation layer includes at least one intermediate inorganic film and at least one intermediate organic film. The circuit element includes the signal lines, the scanning driving circuit GDC, the pixel driving circuit of the pixel PX, the photo sensor of the photo pixel, and the photo driving circuit of the photo pixel, which are described with reference to FIG. 2. Detailed description for this will be made later.

The display element layer 300 is disposed on the driving layer 200. The display element layer 300 includes a display element. In an exemplary embodiment of the invention, the display element may be an organic light emitting diode. The display element layer 300 may further include an organic layer such as a pixel definition film.

The sealing layer 400 seals the display element layer 300. The sealing layer 400 includes at least one inorganic film (hereinafter referred to as a sealing inorganic film). The sealing layer 400 may further include at least one organic film (hereinafter referred to as a sealing organic film). The sealing inorganic film protects the display element layer 300 from moisture/oxygen, and the sealing organic film protects the display element layer 300 from foreign substances such as dust particles. In an exemplary embodiment, the sealing organic layer may include a silicon nitride layer, a silicon oxynitride layer, and a silicon oxide layer, a titanium oxide layer, or an aluminum oxide layer, for example. In an exemplary embodiment, the sealing organic layer may include an acryl-based organic layer, for example, but is not limited thereto.

The display panel DP may further include a touch sensing unit TS disposed on the sealing layer 400. The touch sensing unit TS obtains coordinate information of an external input. The touch sensing unit TS may be disposed directly on the sealing layer 400. In this specification, "directly disposed" means "being formed" through a continuous process, excluding "attached" through an additional adhesive layer. However, the invention is not limited thereto, and the touch sensing unit TS may be attached to the sealing layer 400 through an adhesive as a separate independent module.

The touch sensing unit TS may have a multi-layer structure. The touch sensing unit TS may include a single layer or a multilayer conductive layer. The touch sensing unit TS may include a single layer or a multilayer insulation layer.

The touch sensing unit TS, for example, may sense an external input in a capacitive manner. In the invention, an operating method of the touch sensing unit TS is not limited especially and according to an exemplary embodiment of the invention, the touch sensing unit TS may sense an external input through an electromagnetic induction method or a pressure detection method.

Figure 5:
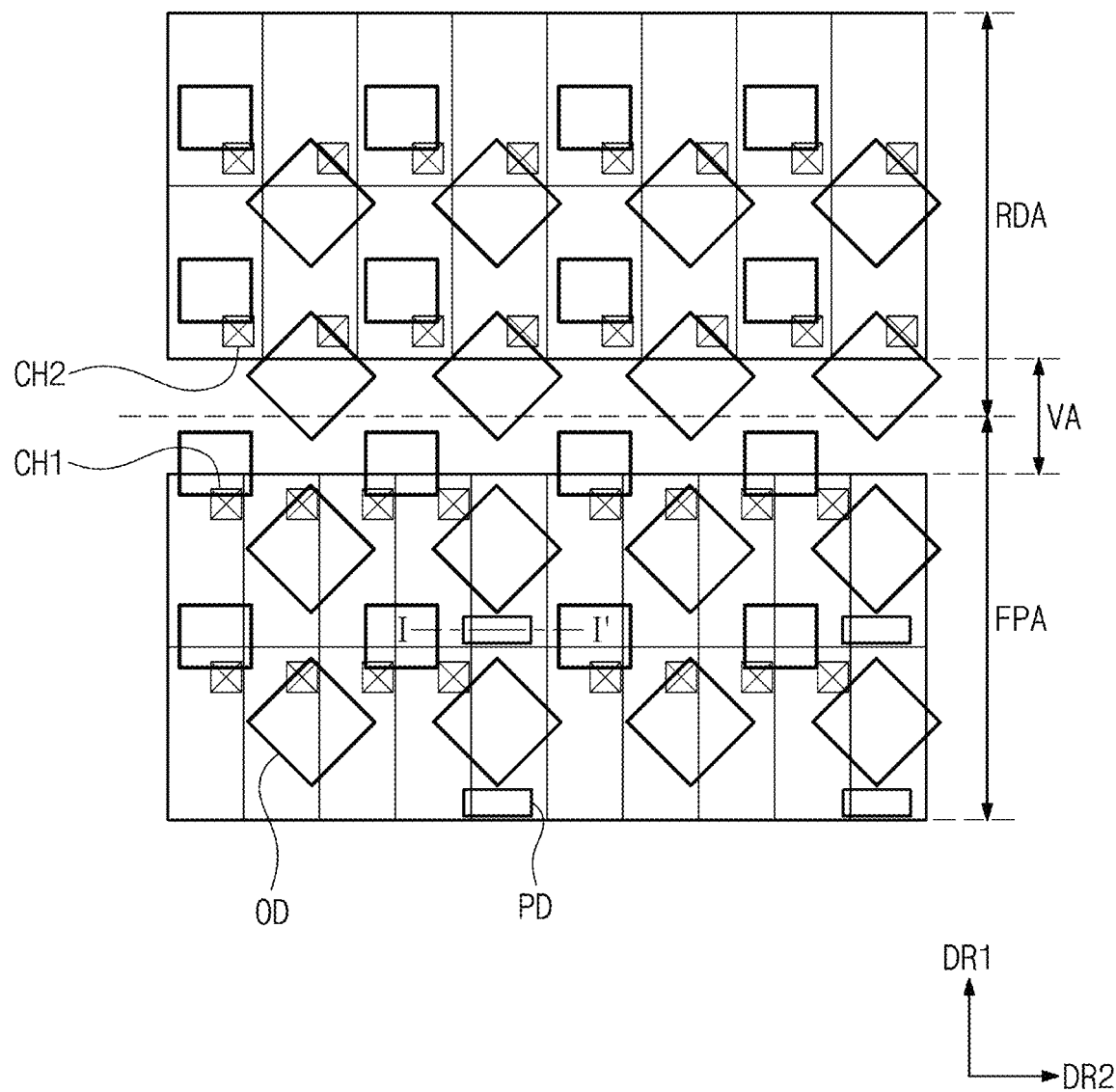
FIG. 5 is a plan view showing an exemplary embodiment of a driving layer and a display element layer of a display panel according to the invention shown in FIG. 2.
Figure 6:
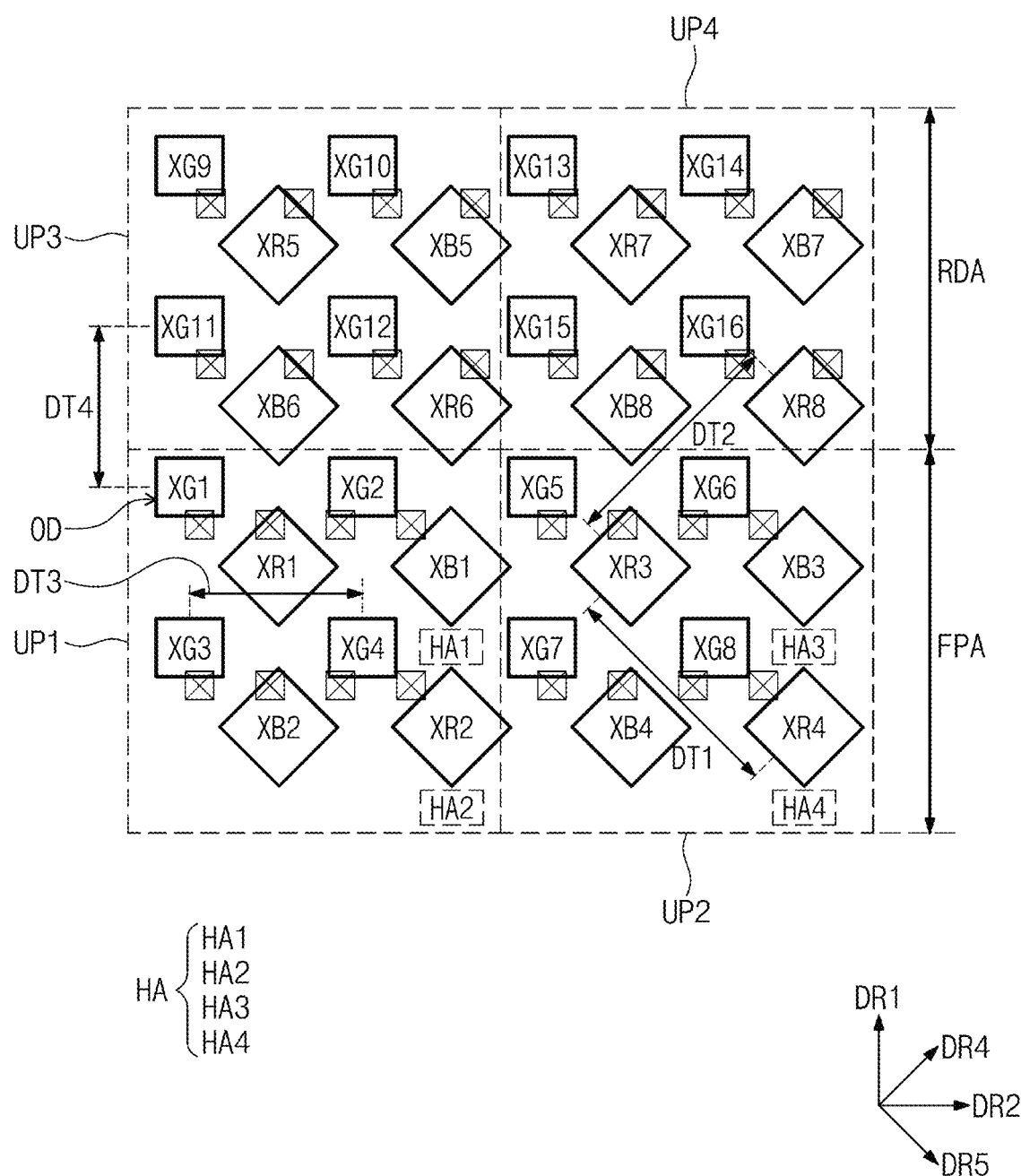
FIG. 6 is a view showing a display element layer in FIG. 5.
Figure 7:
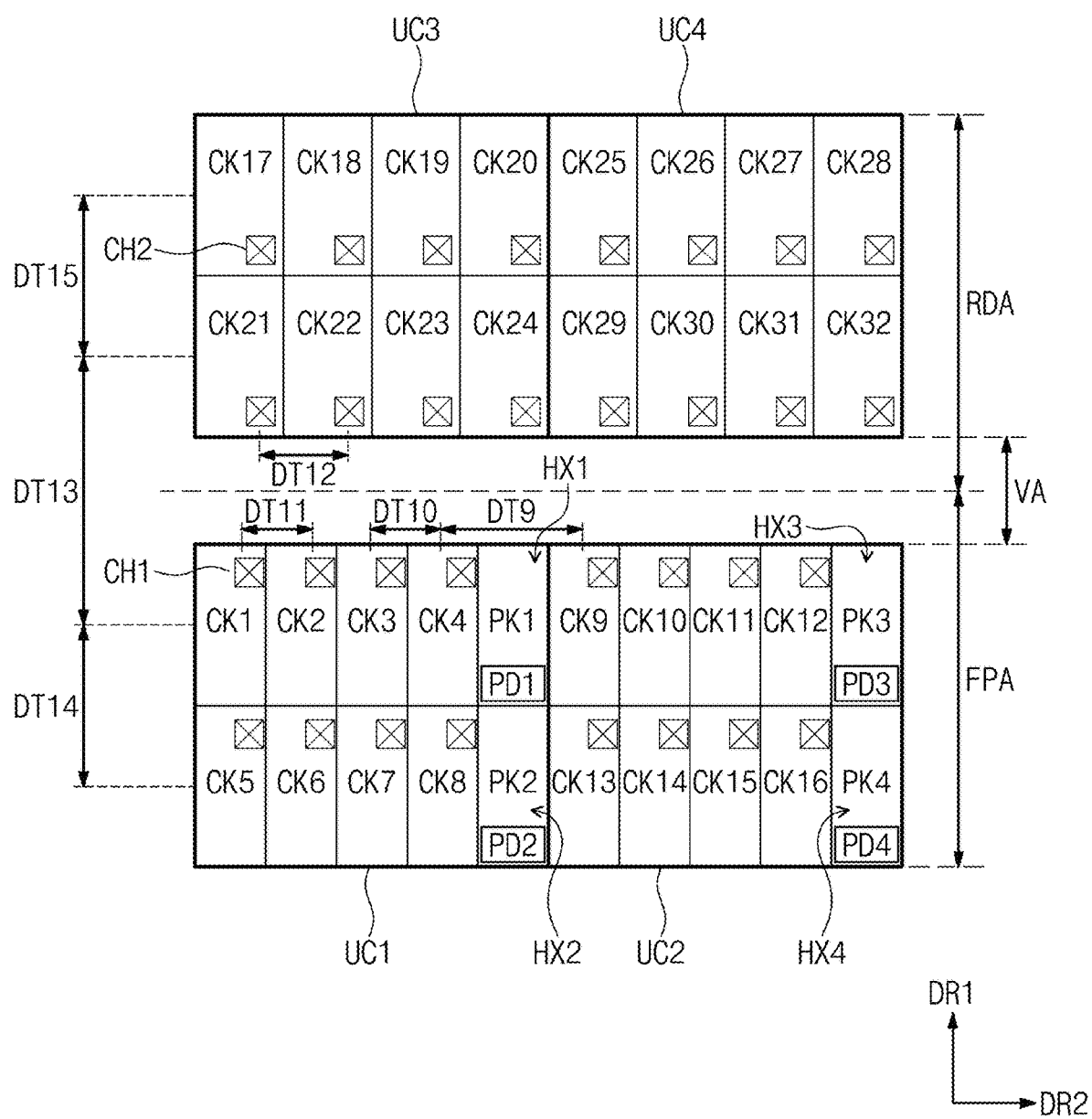
FIG. 7 is a view showing a driving layer in FIG. 5.

FIG. 5 is a plan view showing a driving layer and a display element layer of a display panel according to an exemplary embodiment of the invention shown in FIG. 2. FIG. 6 is a view showing a display element layer in FIG. 5. FIG. 7 is a view showing a driving layer in FIG. 5. FIGS. 5 to 7 are enlarged views of a partial area AA of a display panel DP shown in FIG. 2.

Hereinafter, a distance between display elements means a distance between the centers of the respective display elements.

Referring to FIGS. 4 to 6, the display element layer 300 may include first display element groups UP1 and UP2 disposed in a light sensing area FPA and second display element groups UP3 and UP4 disposed in a normal display area RDA.

Each of the first display element groups UP1 and UP2 may be the minimum display elements repeatedly arranged in the light sensing area FPA. In FIG. 6, the same two first display elements UP1 and UP2 are shown, and this is described below based on one first display element group UP1.

The first display element group UP1 may include N display elements OD. N may be a natural number and may be set variously. The display elements disposed in the first display element group UP1 may be defined as first display elements. In the exemplary embodiment of the invention, the first display element group UP1 includes two red display elements XR1 and XR2, two blue display elements XB1 and XB2, and four green display elements XG1 to XG4. The green display elements XG1 to XG4 have smaller areas than those of the red display elements XR1 and XR2 and the blue display elements XB1 and XB2, respectively, and the number of green display elements XG1 to XG4 is greater than the number of red display elements XR1 and XR2 and is greater than the number of blue display elements XB1 and XB2. In an exemplary embodiment of the invention, because the human eye has a relatively high perceived resolution to green compared to red and blue, the number of green display elements XG1 to XG4 may be provided relatively greater than that of the red display elements XR1 and XR2 and that of the blue display elements XB1 and XB2 to improve green resolution.

However, the invention is not limited thereto, and the number of display elements included in the first display element group UP1, the color ratio of display elements, and the like may be variously adjusted.

Photo pixel areas HA1 to HA4 may be defined in the display element layer 300. The photo pixel areas HA1 and HA2 may be areas where photo sensors PD1 to PD4 (refer to FIG. 7) are disposed.

The photo pixel areas HA1 to HA4 may be defined between the display elements OD in the plan view. In FIG. 6, when taking one photo pixel area HA1 as an example, the photo pixel area HA1 may be defined in an area surrounded by the red display element XR2, the blue display element XB1, and the two adjacent green display elements XG4 and XG7. The number and positions of the photo pixel areas HA1 to HA4 may be variously defined.

Each of the second display element groups UP3 and UP4 may be the minimum display elements repeatedly arranged in the normal display area RDA. In FIG. 6, the same two second display elements UP3 and UP4 are shown, and this is described below based on one second display element group UP3.

The second display element group UP3 may include N display elements OD. The second display element group UP3 may have substantially the same structure as that of the first display element group UP1. The display elements disposed in the second display element group UP3 may be defined as second display elements. In the exemplary embodiment of the invention, the second display element group UP3 includes two red display elements XR5 and XR6, two blue display elements XB5 and XB6, and four green display elements XG9 to XG12. A photo pixel area is not defined between the display elements OD of the second display element group UP3.

The first display element group UP1 and the second display element group UP3 have the same arrangement structure of the display elements OD. That is, the minimum distances between predetermined color display elements adjacent to each other in a predetermined direction or a direction orthogonal to the predetermined direction may be substantially all the same.

In an exemplary embodiment, the distance DT1 between the two red display elements XR3 and XR4 of the first display element group UP2 in the fifth direction DR5 may be substantially identical to the distance DT2 between the red display elements XR3 of the first display element group UP2 and the red display element XR8 of the second display element group UP4 in the fourth direction DR4 orthogonal to the fifth direction DR5, for example. In the same manner, the distance DT3 between the two green display elements XG1 and XG2 of the first display element group UP1 in the second direction DR2 may be substantially identical to the distance DT4 between the green display elements XG1 of the first display element group UP1 and the green display element XG11 of the second display element group UP3 in the first direction DR1 orthogonal to the second direction DR2.

According to an exemplary embodiment of the invention, even when the photo pixel areas HA1 to HA4 are provided in the light sensing area FPA, the arrangement structure of the display elements is not changed, so that the display device may keep the resolution within the display area constant regardless of the area.

Figure 8A:
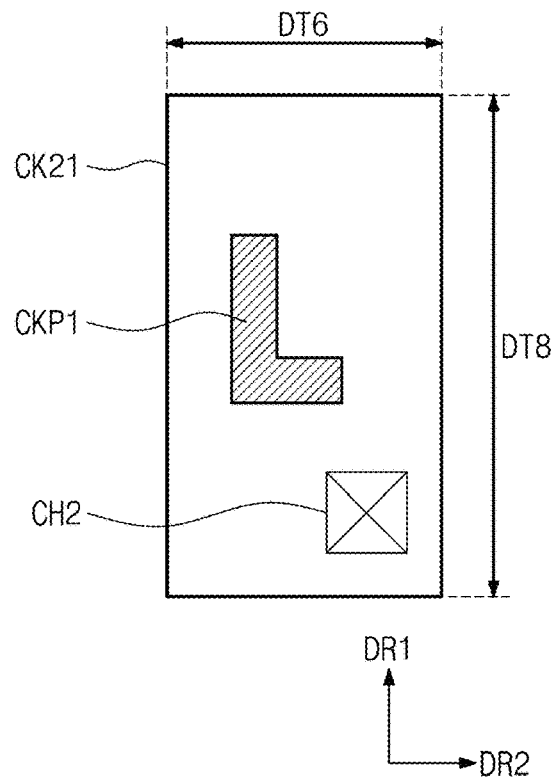
FIG. 8A is a conceptual diagram showing one pixel driving circuit of a first unit driving circuit shown in FIG. 7.
Figure 8B:
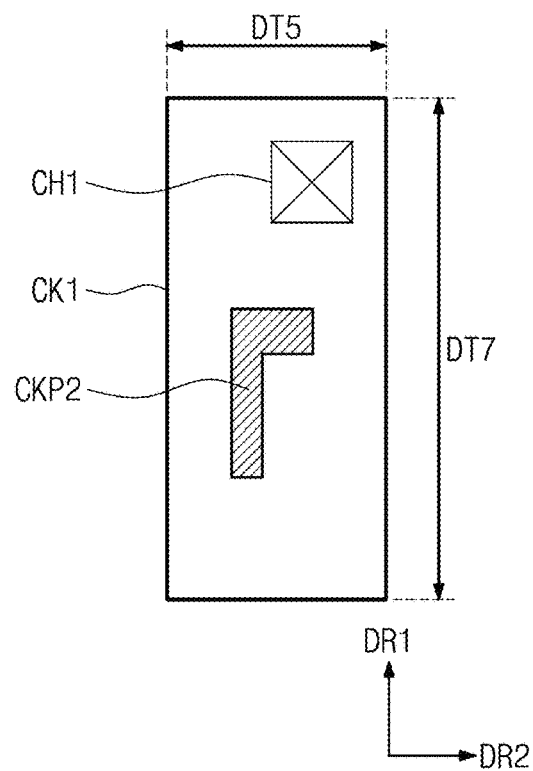
FIG. 8B is a conceptual diagram of one pixel driving circuit of a second unit driving circuit shown in FIG. 7.

FIG. 8A is a conceptual diagram showing one pixel driving circuit of a first unit driving circuit shown in FIG. 7, and FIG. 8B is a conceptual diagram of one pixel driving circuit of a second unit driving circuit shown in FIG. 7.

Hereinafter, the distance between the pixel driving circuits means the distance between the centers of the areas occupied by each of the pixel driving circuits.

Referring to FIGS. 4, 5, 7, 8a and 8b, the driving layer 200 may include the first driving circuit groups UC1 and UC2 disposed in the light sensing area FPA, and the second driving circuit groups UC3 and UC4 disposed in the normal display area RDA.

Each of the first driving circuit groups UC1 and UC2 may be a minimum unit circuit that is repeatedly arranged in the light sensing area FPA. In FIG. 7, the same two first driving circuit groups UC1 and UC2 are shown, and this is described below based on the first driving circuit group UC1 for convenience.

The first driving circuit group UC1 includes circuits for driving the first display element group UP1 (refer to FIG. 6) and photo pixels HX1 and HX2. One first driving circuit group UC1 includes N pixel driving circuits CK1 to CK8. The photo pixels HX1 and HX2 may respectively include photo driving circuits PK1 and PK2 and photo sensors PD1 and PD2.

N may be a natural number, and the number of pixel driving circuits CK1 to CK8 may be changed according to the arrangement structure of the pixel PX provided in the first display element group UP1. In an exemplary embodiment of the invention, since the display elements PX have a structure in which eight display elements (e.g., two red display elements, two blue display elements, and four green display elements) are repeatedly arranged, the number of pixel driving circuits CK1 to CK8 may also be eight, for example.

The pixel driving circuits CK1 to CK8 of the first driving circuit group UC1 may include transistors and capacitors for driving the corresponding display element OD of the first display element group UP1. Predetermined circuits of the pixel driving circuits CK1 to CK8 are described below.

The photo sensors PD1 and PD2 are disposed to overlap with the photo pixel areas HA1 and HA2 shown in FIG. 6.

The number and positions of the photo pixel areas HA1 and HA2 of FIG. 6 are determined by the number and positions of the photo pixels HX1 and HX2.

The photo driving circuits PK1 and PK2 may include transistors and capacitors for driving the photo sensors PD1 and PD2. Predetermined circuits of the pixel driving circuits PK1 and PK2 are described below.

Each of the second driving circuit groups UC3 and UC4 may be a minimum unit circuit that is repeatedly arranged in the normal display area RDA. In FIG. 7, the same two second driving circuit groups UC3 and UC4 are shown, and this is described below based on the second driving circuit group UC3 for convenience.

The second driving circuit group UC3 includes circuits for driving the second display element group UP3 (refer to FIG. 6). The second driving circuit group UC3 may include N pixel driving circuits CK17 to CK24. The pixel driving circuits CK17 to CK24 of the second driving circuit group UC3 may include transistors and a capacitor for driving the corresponding display elements of the second display element group UP3.

The areas occupied by the first driving circuit group UC1 and the second driving circuit group UC3 may be substantially equal to each other. The number of pixel driving circuits disposed in each of the first driving circuit group UC1 and the second driving circuit group UC3 is the same and the photo driving circuits PK1 and PK2 are further disposed in the first driving circuit group UC1. Therefore, the area occupied by the pixel driving circuits CK1 to CK8 of the first driving circuit group UC1 may be smaller than the area occupied by the pixel driving circuits CK17 to CK24 of the second driving circuit group UC3. In an exemplary embodiment, the area occupied by each of the pixel driving circuits CK1 to CK8 in the first driving circuit group UC1 may be the same with one another, and the area occupied by each of the pixel driving circuits CK17 to CK24 in the second driving circuit group UC3 may be the same with one another. However, the invention is not limited thereto.

According to an exemplary embodiment of the invention, the width DT5 of the area occupied by one pixel driving circuit CK1 of the first driving circuit group UC1 in the second direction DR2 may be less than the width DT6 of the area occupied by one pixel driving circuit CK21 of the second driving circuit group UC3 in the second direction DR2. The width DT7 of the area occupied by one pixel driving circuit CK1 of the first driving circuit group UC1 in the first direction DR1 may be identical to the width DT8 of the area occupied by one pixel driving circuit CK21 of the second driving circuit group UC3 in the first direction DR1. However, the invention is not limited thereto. When the area occupied by the pixel driving circuit CK1 of the first driving circuit group UC1 is smaller than the area occupied by the pixel driving circuit CK21 of the second driving circuit group UC3, the shape of the pixel driving circuit CK1 of the first driving circuit group UC1 may be changed variously.

The distance between two pixel driving circuits that are adjacent to each other in a predetermined direction with the photo pixels HX1 and HX2 therebetween may be different from the distance between two pixel driving circuits arranged continuously in a predetermined direction. In an exemplary embodiment, the photo pixel HX1 is disposed between the pixel driving circuit CK4 of the first driving circuit group UC1 and the pixel driving circuit CK9 of the first driving circuit group UC2 in the second direction DR2, for example. The pixel driving circuits CK3 and CK4 of the first driving circuit group UC1 are continuously arranged in the second direction DR2. The distance DT9 between the pixel driving circuits CK4 and CK9 in the second direction DR2 may be greater than the distance DT10 between the pixel driving circuits CK3 and CK4 in the second direction DR2.

The pixel driving circuits CK1 to CK8 of the first driving circuit group UC1 are connected to the corresponding display elements XG1 to XG4, XR1, XR2, XB1, and XB2 of the first display element group UP1 through first contact holes CH1. In addition, the pixel driving circuits CK17 to CK24 of the second driving circuit group UC3 are connected to the corresponding display elements XG9 to XG12, XR5, XR6, XB5, and XB6 of the second display element group UP3 through second contact holes CH2. The distance DT11 between the first contact holes CH1 in the second direction DR2 may be smaller than the distance DT12 between the second contact holes CH2 in the second direction DR2. Although the distance between the first contact holes CH1 becomes smaller than the distance between the second contact holes CH2, it is not affected that the pixel driving circuits CK1 to CK8 of the first driving circuit group UC1 and the display elements XG1 to XG4, XR1, XR2, XB1 and XB2 of the first display element group UP1 are connected. That is, although the display elements of the first and second display element groups UP1 to UP4 are regularly disposed, the position of the first contact hole CH1 may be partially changed.

The distance between the first contact holes CH1 in the first direction DR1 and the distance between the second contact holes CH2 in the first direction DR1 and the distance between the first contact holes CH1 and the second contact hole CH2 in the first direction DR1 may be the same.

The first driving circuit group UC1 and the second driving circuit group UC3 may be spaced apart in the first direction DR1. An area between the first driving circuit group UC1 and the second driving circuit group UC3 in the first direction DR1 may be defined as a vacant area VA. The pixel driving circuits CK1 to CK32 or the photo pixels HX1 to HX4 are not disposed in the vacant area VA of the driving layer 200. The vacant area VA may be defined to traverse the display area DA (refer to FIG. 2) of the display panel DP along the second direction DR2.

The pixel driving circuit CK1 of the first driving circuit group UC1 and the pixel driving circuit CK21 of the second driving circuit group UC3 may have an inverted shape with respect to an axis extending in the second direction DR2. By changing the position of the first contact hole CH1 in the pixel driving circuit CK1 of the first driving circuit group UC1 and the position of the second contact hole CH2 in the pixel driving circuit CK21 of the second driving circuit group UC3, it is possible to secure the vacant area VA while maintaining the distance between the first contact hole CH1 and the second contact hole CH2 in the first direction DR1.

The distance DT13 between the pixel driving circuit CK1 of the first driving circuit group UC1 and the pixel driving circuit CK21 of the second driving circuit group UC3, which are adjacent to each other in the first direction DR1, is greater than the distance DT14 between two pixel driving circuits CK1 and CK5, which are included in the respective first driving circuit groups UC1 and adjacent to each other in the first direction DR1 and the distance DT15 between the two second pixel driving circuits CK17 and CK21, which are included in the respective second driving circuit groups UC3 and adjacent to each other in the first direction DR1.

Referring to FIGS. 8A and 8B, the pixel driving circuit CK21 of the second driving circuit group UC3 and the pixel driving circuit CK1 of the first driving circuit group UC1 corresponding thereto are shown. It is shown that a portion CKP1 of a circuit disposed in the pixel driving circuit CK21 has an "L" shape in the plan view. It is shown that a portion CKP2 of a circuit disposed in the pixel driving circuit CK1 has an inversed "L" shape. However, since the width DT5 of the pixel driving circuit CK1 in the second direction DR2 is smaller than the width DT6 of the pixel driving circuit CK21, the width of the portion CKP2 of the circuit disposed in the pixel driving circuit CK1 in the first direction DR1 is smaller than the width of the portion CKP1 of the circuit disposed in the pixel driving circuit CK21.

Figure 9:
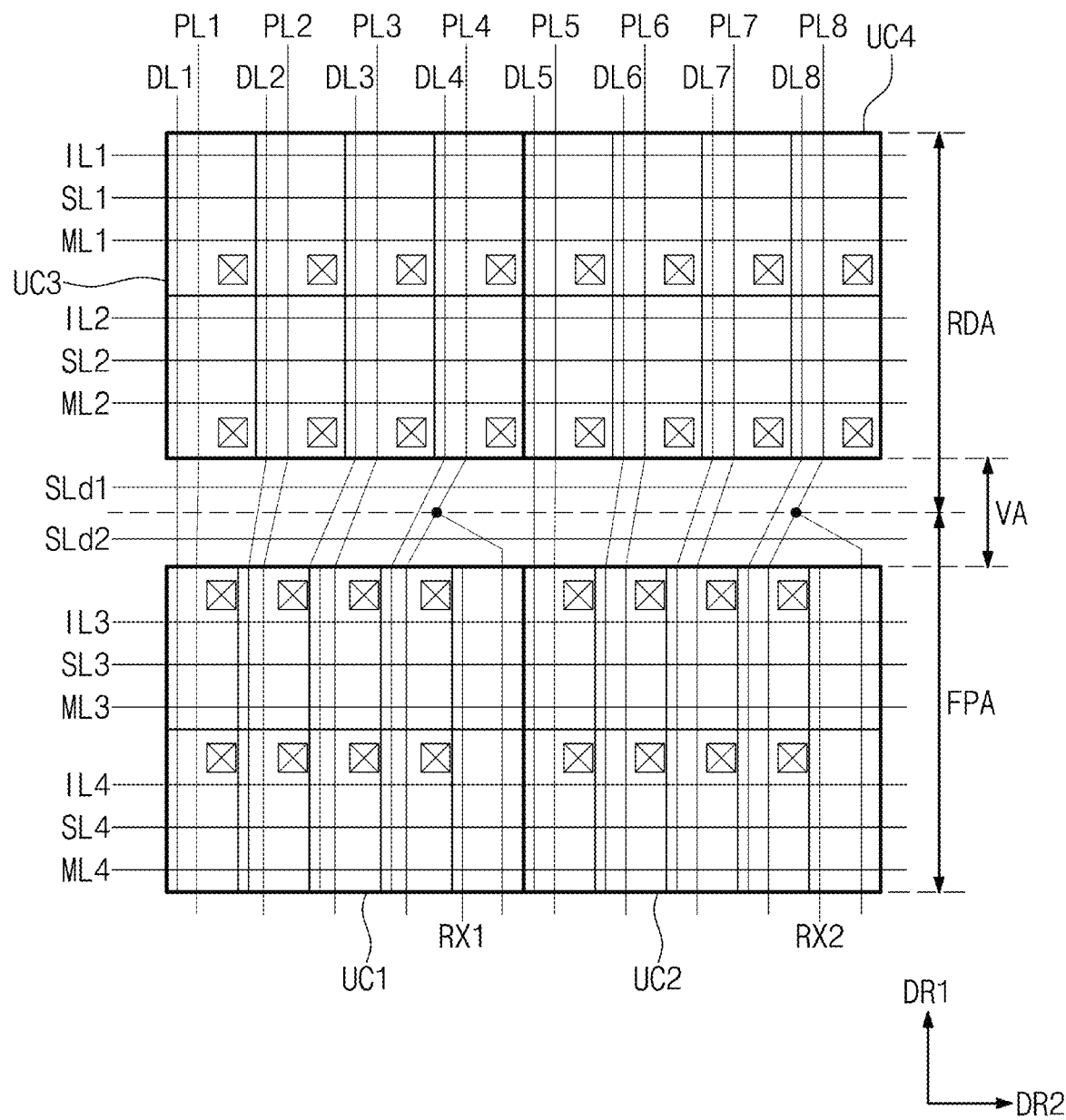
FIG. 9 is a view showing a driving layer including signal lines in FIG. 5.

FIG. 9 is a view showing a driving layer including signal lines in FIG. 5. FIG. 9 is an enlarged view of a partial area AA of a display panel DP shown in FIG. 2.

Referring to FIGS. 4, 5, 7 and 9, the signal lines of the driving layer 200 include scanning lines SL1 to SL4, data lines DL1 to DL8, power lines PL1 to PL8, initialization lines IL1 to IL4, light-emission lines ML1 to ML4, and sensing lines RX1 and RX2. The predetermined function of each signal line will be described later.

The transistors and the capacitors provided in each of the pixel driving circuits CK1 to CK32 may be connected to at least one of the scanning lines SL1 to SL4, at least one of the data lines DL1 to DL8, at least one of the power lines PL1 to PL8, at least one of the initialization lines IL1 to IL4, and at least one of the light-emission lines ML1 to ML4.

The transistors and the capacitors included in each of the photo driving circuits PK1 to PK4 may be connected to at least one of the sensing lines RX1 and RX2.

In an exemplary embodiment of the invention, the widths of the pixel driving circuits CK1 to CK16 disposed in the first driving circuit groups UC1 and UC2 in the second direction DR2 and the widths of the pixel driving circuit CK17 to CK32 disposed in the second driving circuit groups UC3 and UC4 are different. Therefore, alternatively, the signal lines, for example, the power lines PL1 to PL8 and data lines DL1 to DL8, extending along the first direction DR1 may have a partially bent shape in a vacant area VA between the first driving circuit groups UC1 and UC2 and the second driving circuit groups UC3 and UC4

When it is assumed that there is no vacant area VA, for example, the power line PL2 extends in the first direction DR1 until it passes the second driving circuit group UC3, is bent drastically in the second direction DR2 immediately after passing the second driving circuit group UC3, and then is bent again in the first direction DR1 and passes the first driving circuit group UC1. However, this type of wiring structure is not easy to be designed and consequently degrades the display quality.

In an exemplary embodiment of the invention, by securing the vacant area VA, some of the signal lines between the first and second driving circuit groups UC1 and UC3 may easily change the extending direction.

Also, some of the signal lines, for example, the power lines PL4 and PL8, may be connected to the transistors of the photo driving circuits PK1 to PK4. When description is made based on the fourth power line PL4, for example, the power line PL4 may be branched in the vacant area VA and provided to the pixel driving circuits CK3 and CK7 and the photo driving circuit PK1 to PK2 of the first driving circuit group UC1.

The driving layer 200 may further include dummy scanning lines SLd1 and SLd2. The dummy scanning lines SLd1 and SLd2 may be connected to the pixel driving circuit of the second driving circuit group UC2 to provide a signal for initializing the pixel driving circuit of the second driving circuit group UC2. The dummy scanning lines SLd1 and SLd2 may be disposed in the vacant area VA.

Figure 10:
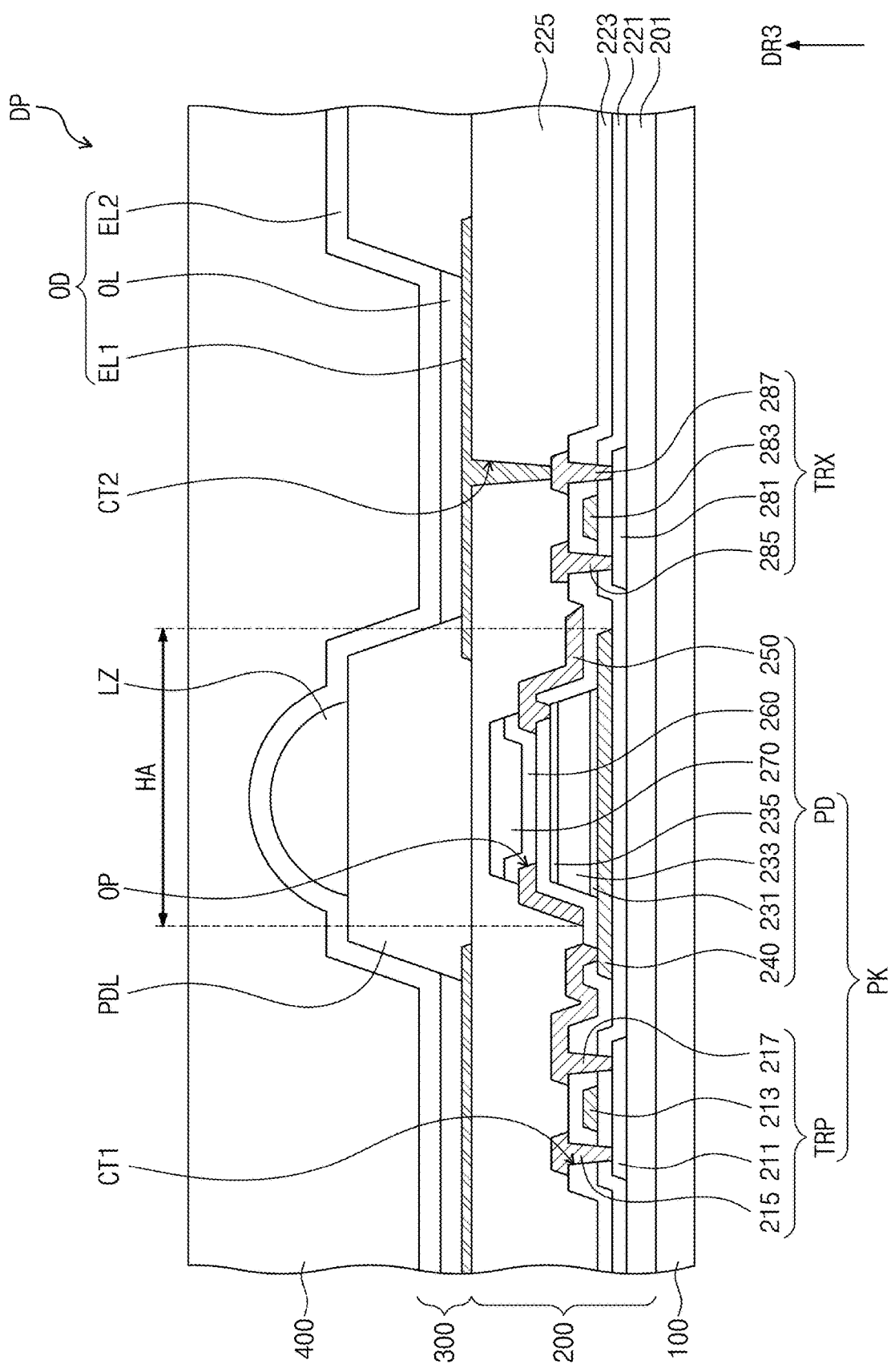
FIG. 10 is a cross-sectional view of a display panel taken along line I-I' in FIG. 5.

FIG. 10 is a cross-sectional view of a display panel taken along line I-I' in FIG. 5.

Referring to FIGS. 7 and 10, the photo driving circuit PK1 to PK4 of the driving layer 200 may include phototransistors. The photo driving circuit PK1 to PK4 may include a plurality of photo transistors, but one photo transistor TRP connected to the photo sensor PD is illustratively shown in FIG. 10.

The pixel driving circuits CK1 to CK32 of the driving layer 200 may include pixel transistors and one pixel transistor TRX connected to the first electrode EL1 of the display element OD is illustratively shown in FIG. 10.

A buffer layer 201 for blocking the penetration of impurities may be disposed on the substrate 100. In an exemplary embodiment, the buffer layer 201 may include an inorganic material such as silicon oxide, silicon nitride, silicon oxynitride, aluminum oxide, aluminum nitride, titanium oxide, or titanium nitride, or may include an organic material such as polyimide, polyester, or acrylic, or may include a stack of a plurality of materials selected from the above-listed materials.

The photo transistor TRP of the photo driving circuit PK includes an active layer 211, a gate electrode 213, a source electrode 215, and a drain electrode 217.

The active layer 211 may be disposed on the buffer layer 201. The driving layer 200 may further include a first insulation layer 221 disposed between the active layer 211 and the gate electrode 213. The first insulation layer 221 may insulate the active layer 211 from the gate electrode 213. The source electrode 215 and the drain electrode 217 may be disposed on the gate electrode 213. The driving layer 200 may further include a second insulation layer 223 disposed between the gate electrode 213 and the source electrode 215 and between the gate electrode 213 and the drain electrode 217. The source electrode 215 and the drain electrode 217 may be connected to the active layer 211 through the contact holes CT1 provided in the first insulation layer 221 and the second insulation layer 223, respectively.

The structure of the photo transistor TRP is not limited to the structure shown in FIG. 10, and the positions of the active layer 211, the gate electrode 213, the source electrode 215, and the drain electrode 217 may be modified in various forms. In another exemplary embodiment, in FIG. 10, the gate electrode 213 may be disposed below the active layer 211, for example.

The photo sensor PD may include a lower metal layer 240, an upper metal layer 250, a first active layer 231, a second active layer 235, and a third active layer 233.

The lower metal layer 240 may include a metallic material. The lower metal layer 240 may block light incident on the first to third active layers 231, 233, and 235. The lower metal layer 240 may be connected to the drain electrode 217 of the photo transistor TRP. The lower metal layer 240 may be an anode or a cathode.

The upper metal layer 250 may cover the edges of the photo sensor PD to block light incident on the edges of the first to third active layers 231, 233, and 235. An opening OP exposing a portion of the second active layer 235 may be defined in the upper metal layer 250 in correspondence to the central portions of the first to third active layers 231, 233, and 235 to provide a path through which light is incident on the first to third active layers 231, 233, and 235. The upper metal layer 250 may be a cathode when the first electrode 231 is an anode, or an anode when the first electrode 231 is a cathode. The upper metal layer 250 may be connected to any one of the signal lines to receive a signal provided from the connected signal line.

The lower metal layer 240 and the upper metal layer 250 again reflects light, which is not absorbed by the first to third active layers 231, 233, and 235, and reflected, to the inside to increase the light absorption rate of the first to third active layers 231, 233, and 235. Accordingly, the sensing sensitivity of the photo sensor PD may be improved by the lower metal layer 240 and the upper metal layer 250.

The first active layer 231 may be disposed on the lower metal layer 240 and may contact the lower metal layer 240.

The second active layer 235 may be disposed below the upper metal layer 250 and may contact the upper metal layer 250. The second active layer 235 may be connected to the upper metal layer 250 through a contact hole defined in the second insulation layer 223.

The third active layer 233 is disposed between the first active layer 231 and the second active layer 235. The third active layer 233 may be an intrinsic semiconductor.

Depending on which one of an anode and a cathode each of the lower metal layer 240 and the upper metal layer 250 functions as, the first active layer 231 and the second active layer 235 may be a P-type semiconductor or an N-type semiconductor in order and vice versa. The third active layer 233 may be an intrinsic semiconductor.

When light is incident on the photo sensor PD, holes and electrons are generated in the third active layer 233, and a current is generated by the movement thereof. The photo driving circuit PK senses the current flowing to the lower metal layer 240 of the photo sensor PD to sense the user's input applied to the photo pixel area HA. The light source of the photo sensor PD for sensing the user's input may be a display element OD adjacent to the photo sensor PD. A part of the light emitted from the display element OD may be reflected by the user's finger or the like overlapping with the photo pixel area HA and then, may be incident on the photo sensor PD.

The photo sensor PD may further include an absorption filter 260 and an interference filter 270.

The absorption filter 260 is disposed on the upper metal layer 250 and covers the opening OP provided in the upper metal layer 250. The absorption filter 260 may selectively absorb light of a predetermined wavelength. The transmission band of the absorption filter 260 may overlap the light-emission band of the display element OLD. The absorption filter 260 may improve the sensitivity of the photo sensor PD by removing noise due to external light except for the display element OLD.

The interference filter 270 may be disposed on the absorption filter 260. The interference filter 270 may selectively transmit light incident at a predetermined range of angles. Various angles of light may be incident on the photo sensor PD, and the resolution of a user input decreases as the angle of the incident light is varied. The photo sensor PD more precisely sense a user's input by receiving only a limited range of angles through the interference filter 270.

The positions of the absorption filter 260 and the interference filter 270 may be changed with each other, and at least one filter may be omitted in other exemplary embodiments.

The pixel transistor TRX includes an active layer 281, a gate electrode 283, a source electrode 285, and a drain electrode 287.

In an exemplary embodiment of the invention, the active layer 281, gate electrode 283, source electrode 285, and drain electrode 287 of the pixel transistor TRX are substantially the same as the respective components of the photo transistor TRP. Therefore, detailed description thereof will be omitted. However, the invention is not limited thereto, and the positions of the respective components of the pixel transistor TRX and the photo transistor TRP may be different from each other.

The driving layer 200 may further include a third insulation layer 225. The third insulation layer 225 may be disposed on the source electrode 215 and the drain electrode 217 of the photo transistor TRP and may be disposed on the source electrode 285 and the drain electrode 287 of the pixel transistor TRX. The third insulation layer 225 may be disposed on the absorption filter 260 and the interference filter 270.

The display element layer 300 may include a display element OD and a pixel definition film PDL.

The pixel definition film PDL is disposed on the third insulation layer 225. The pixel definition film PDL may be disposed to overlap the photo sensor PD.

The pixel definition film PDL may be disposed to partially overlap the first electrode EL1 of the display element OD.

The display element OD may be an organic light-emitting element. The display element OD may include a first electrode ELL an organic layer OL, and a second electrode EL2.

The first electrode EL1 is disposed on the third insulation layer 225. The first electrode EL1 is connected to the drain electrode 287 of the pixel transistor TRX through a contact hole CT2 defined in the third insulation layer 225.

The first electrode EL1 may be a pixel electrode or an anode. The first electrode EL1 may be a transmissive electrode, a semi-transmissive electrode, or a reflective electrode. In an exemplary embodiment, when the first electrode EL1 is a transmissive electrode, the first electrode EL1 may include a transparent metal oxide such as indium tin oxide ("ITO"), indium zinc oxide ("IZO"), zinc oxide (ZnO), and indium tin zinc oxide ("ITZO"), for example. In an exemplary embodiment, when the first electrode EL1 is a semi-transmissive electrode or a reflective electrode, the first electrode EL1 may include a combination of Ag, Mg, Al, Pt, Pd, Au, Ni, Nd, Ir, Cr, or a metal, for example.

The first electrode EL1 may be a single layer or a multilayer structure having a plurality of layers including a transparent metal oxide or metal. In an exemplary embodiment, the first electrode EL1 may be a single layer structure of ITO, Ag, or a metal combination (e.g., a combination of Ag and Mg), a two-layer structure of ITO/Mg or ITO/MgF, or a three-layer structure of ITO/Ag/ITO, for example, but is not limited thereto.

The organic layer OL may include an organic emission layer ("EML") including a low-molecular organic material or a polymer organic material. The organic light emission layer may emit light. In an exemplary embodiment, the organic emission layer OD may selectively further include a hole transport layer ("HTL"), a hole injection layer ("HIL"), an electron transport layer ("ETL"), and an electron injection layer ("EIL") in addition to the organic emission layer, for example.

The second electrode EL2 may be provided on the organic layer OL. The second electrode EL2 may be a common electrode or a cathode. The second electrode EL2 may be a transmissive electrode, a semi-transmissive electrode, or a reflective electrode. In an exemplary embodiment, when the second electrode EL2 is a transmissive electrode, the second electrode EL2 may include Li, Liq, Ca, LiF/Ca, LiF/Al, Al, Mg, BaF, or a combination thereof (e.g., a combination of Ag and Mg).

In an exemplary embodiment, when the second electrode EL2 is a semi-transmissive electrode or a reflective electrode, the second electrode EL2 may include Ag, Liq, Mg, Al, Pt, Pd, Au, Ni, Nd, Ir, Cr, Li, Ca, LiF/Ca, LiF/Al, Mo, Ti, or a combination thereof (e.g., a combination of Ag and Mg). In an alternative exemplary embodiment, the second electrode EL2 may have a multilayer structure including a reflective layer or a semi-transmissive layer including the material, and a transparent conductive layer including ITO, IZO, zinc oxide (ZnO), and ITZO, for example.

The second electrode EL2 may include an auxiliary electrode. In an exemplary embodiment, the auxiliary electrode may include a film provided by depositing the material toward the light emission layer, and a transparent metal oxide on the film such as ITO, IZO, zinc oxide (ZnO), and ITZO, and may include Mo, Ti, Ag, or the like, for example.

When the display element OD is a front light-emission, the first electrode EL1 may be a reflective electrode and the second electrode EL2 may be a transmissive electrode or a semi-transmissive electrode. When the display element OD is a back light-emitting element, the first electrode EL1 may be a transmissive electrode or a semi-transmissive electrode, and the second electrode EL2 may be a reflective electrode.

The display element layer 300 may further include a lens LZ. The lens LZ may be disposed in the photo pixel area HA and may be disposed to overlap the photo sensor PD. The lens LZ may be disposed on a pixel definition film PDL. The lens LZ may include the same material as that of the pixel definition film PDL, and may be provided in the same operation. In particular, the lens LZ may be provided using a multi-tone mask when forming the pixel definition film PDL in the photo pixel area HA. Therefore, the lens LZ may include the same material as that of the pixel definition film PDL.

The lens LZ is not disposed on the pixel definition film PDL between the display elements OLD disposed in the normal display area RDA. The lens LZ functions as a convex lens and focuses light, which is reflected by a user and incident on the lens LZ among lights emitted from the display element OLD, to the photo sensor PD. Therefore, the sensing sensitivity of the photo sensor PD may be improved by the lens LZ.

The sealing layer 400 may be disposed on the second electrode EL2.

Figure 11:
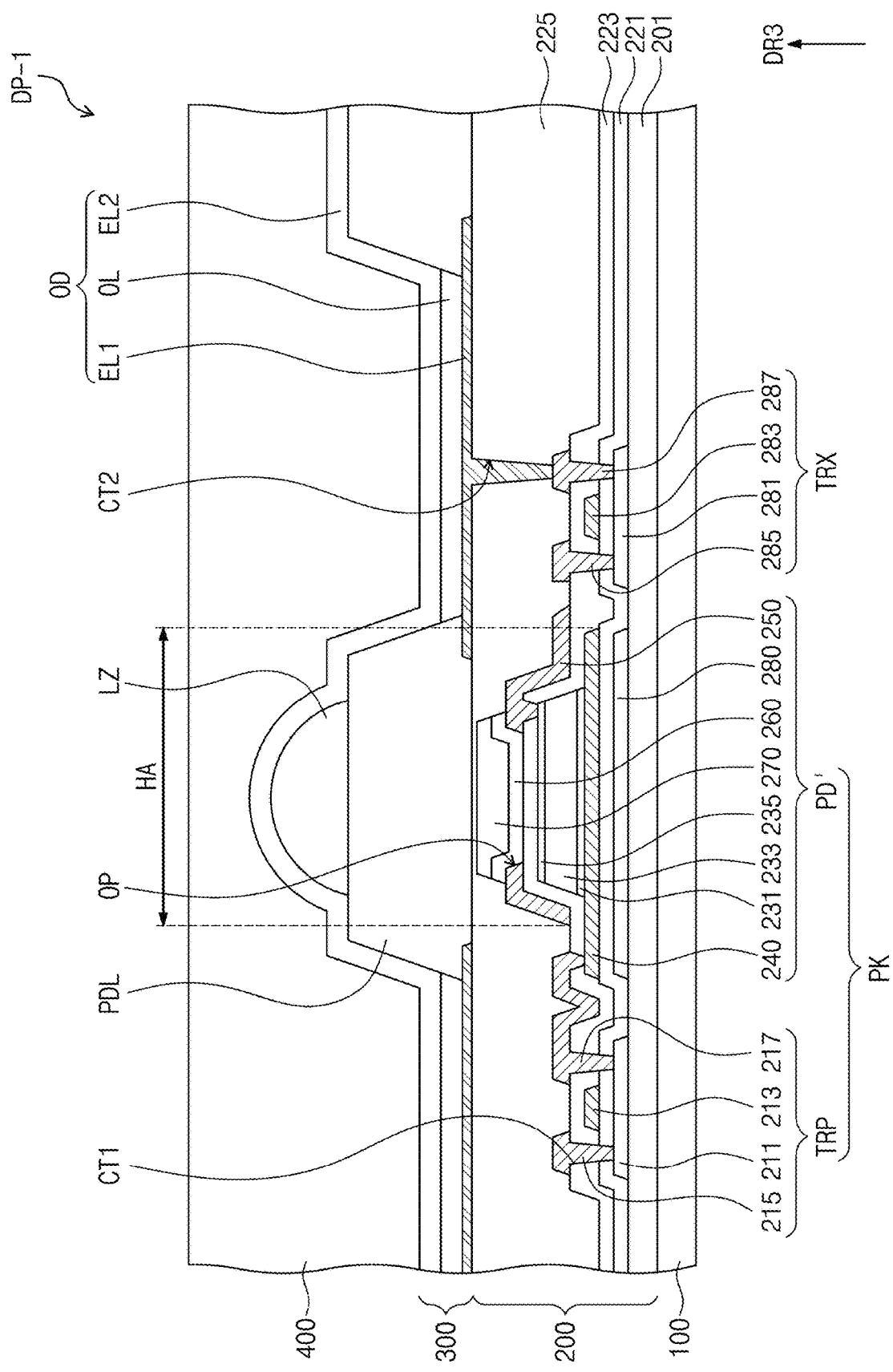
FIG. 11 is a view showing a cross-sectional structure of another exemplary embodiment of a display panel according to the invention.

FIG. 11 is a view showing a cross-sectional structure of a display panel according to another exemplary embodiment of the invention.

A display panel DP-1 shown in FIG. 11 is substantially similar to the display DP shown in FIG. 10 except that it further includes a control layer 280 as compared with the display panel DP described with reference to FIG. 10.

Hereinafter, substantially the same components among the components of FIGS. 10 and 11 are denoted by the same reference numerals, and the control layer 280 will be mainly described.

The driving layer 200 may further include the control layer 280.

The control layer 280 may be disposed below a lower metal layer 240. The control layer 280 may be disposed in the same layer as the active layer 211 of the photo transistor TRP.

The control layer 280 may block the light incident on the first to third active layers 231, 233 and 235 together with the lower metal layer 240 to improve the sensing sensitivity of the photo sensor PD'. Additionally, the control layer 280 also increases the position of the photo sensor PD in the third direction DR3, that is, the thickness direction of the display panel DP-1, so that an optical path through which the light reflected by a user reaches the photo sensor PD may be shortened and as a result, the sensing sensitivity of the photo sensor PD' may be improved. In addition, since the control layer 280 and the lower metal layer 240 form a capacitor and the capacitor is used in a photo driving circuit, the space for forming a capacitor on the planar surface may be omitted, so that it may improve the degree of freedom of circuit design of a photo driving circuit.

In FIG. 11, the control layer 280 is shown as one. However, in another exemplary embodiment, a plurality of control layers may be provided using a layer below the lower metal layer 240.

Figure 12:
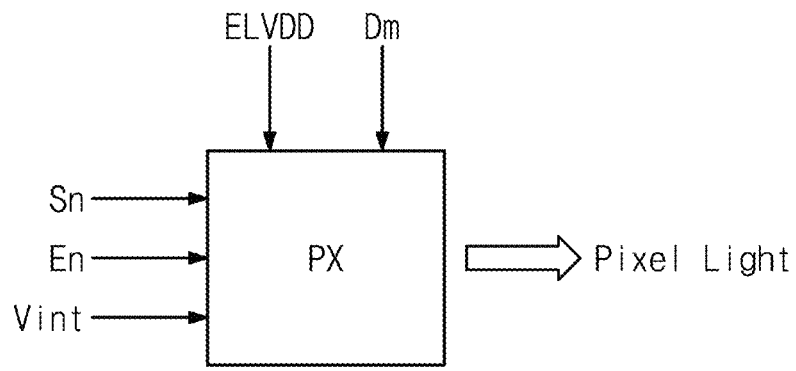
FIG. 12 is a block diagram showing one pixel.
Figure 13:
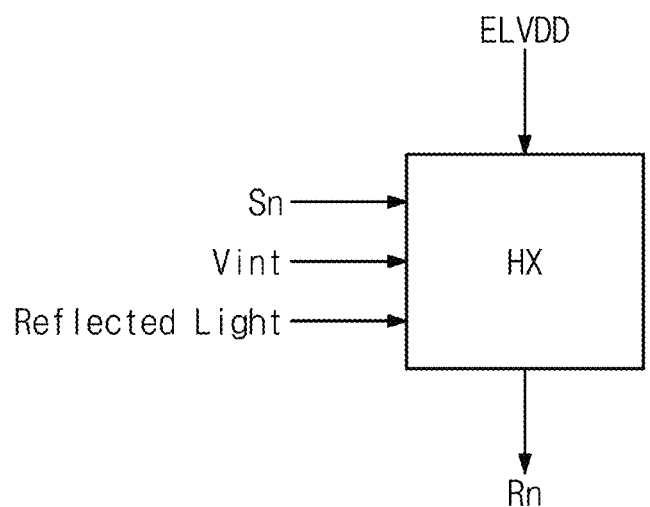
FIG. 13 is one block diagram showing a photo sensor.

FIG. 12 is a block diagram showing one pixel, and FIG. 13 is one block diagram showing a photo sensor.

Referring to FIGS. 10 and 12, in an exemplary embodiment of the invention, the pixel PX may include a pixel driving circuit included in the driving layer 200 of the display panel DP, and a display element OD electrically connected to the pixel driving circuit and included in the display element layer 300.

The pixel PX receives a power voltage ELVDD, a scanning signal Sn, a data signal Dm, an initialization voltage Vint, and an emission control signal En and emits light from the display element OD.

Referring to FIGS. 10 and 13, in an exemplary embodiment of the invention, the photo pixel HX may include a photo driving circuit included in the driving layer 200 of the display panel DP, and a photo sensor PD electrically connected to the photo driving circuit.

Referring to FIG. 13, the photo pixel HX receives the power voltage ELVDD, the scanning signal Sn, the initialization voltage Vint, and light reflected by a user and outputs a sensing signal Rn sensed by a photo sensor.

The photo pixel HX may receive the power voltage ELVDD, the scanning signal Sn, and the initialization voltage Vint applied to the corresponding pixel PX. The photo pixel HX shares the signal line with the pixel PX and outputs the sensing signal Rn using the signal applied to the pixel PX to simplify the design of the photo driving circuit.

Figure 14:
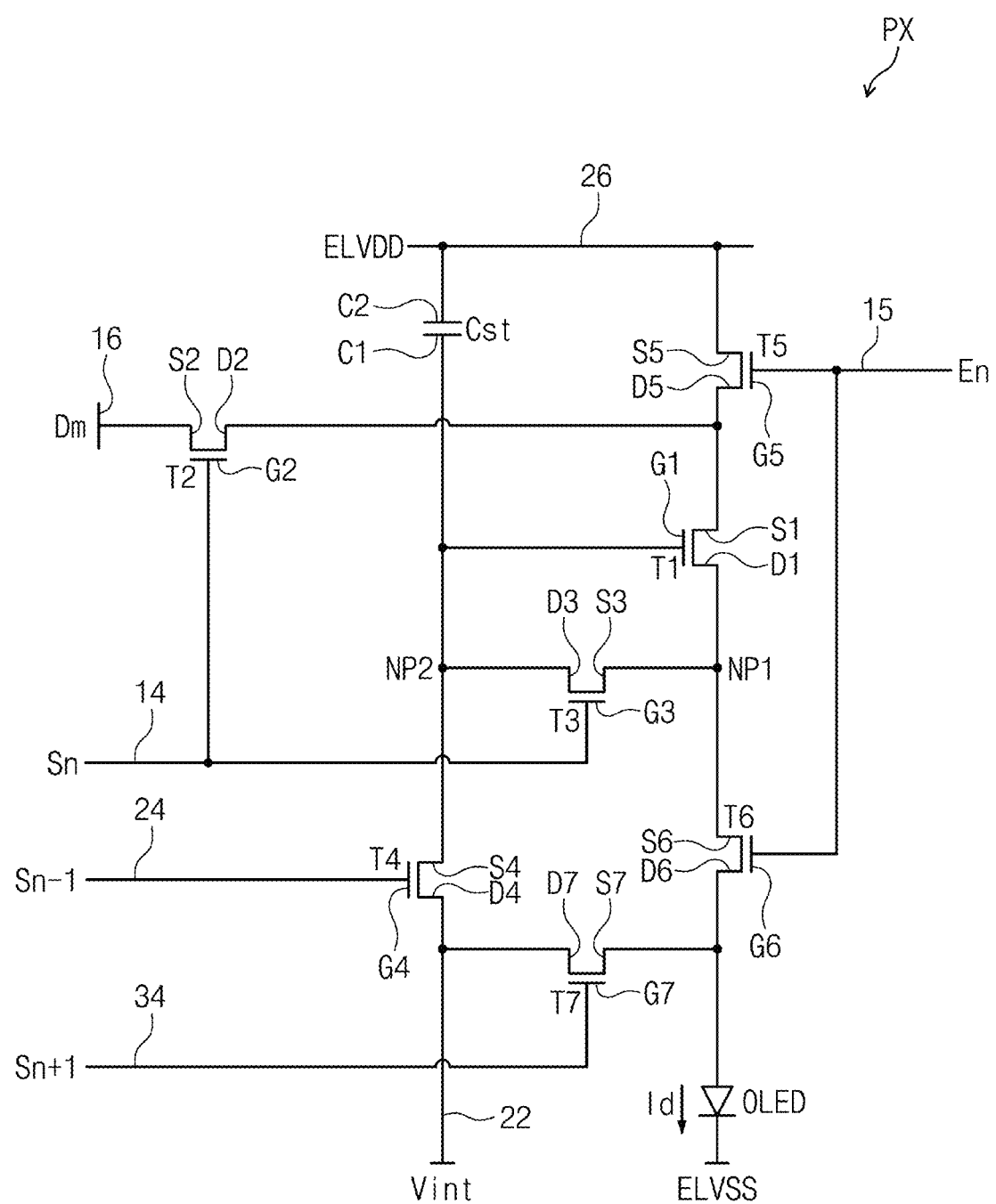
FIG. 14 is a circuit diagram showing one pixel of FIG. 12.

FIG. 14 is a circuit diagram showing one pixel of FIG. 12.

One pixel PX according to an exemplary embodiment of the invention may include a plurality of transistors T1 to T7, a storage capacitor Cst, and an organic emission element OLED.

The TFTs T1 to T7 include a driving transistor T1, a switching transistor T2, a compensation transistor T3, an initialization transistor T4, a first emission control transistor T5, a second emission control transistor T6, and a bypass transistor T7.

The pixel PX is connected to a first scanning line 14 for transmitting the nth scanning signal Sn to the switching transistor T2 and the compensation transistor T3, a second scanning line 24 for transmitting the n−1th scanning signal Sn−1 to the initialization transistor T4, a third scanning line 34 for transmitting the n+1th scanning signal Sn+1 to the bypass transistor T7, a light-emission line 15 for transmitting an emission control signal En to the first emission control transistor T5 and the second emission control transistor T6, a data line 16 for transmitting the data signal Dm, a power line 26 for transmitting the power supply voltage ELVDD, and an initialization line 22 for transmitting the initialization voltage Vint for initializing the driving transistor T1.

The gate electrode G1 of the driving transistor T1 is connected to the first electrode C1 of the storage capacitor Cst. The source electrode S1 of the driving transistor T1 is connected to the power line 26 through the first emission control transistor T5. The drain electrode D1 of the driving transistor T1 is electrically connected to the anode of the organic emission element OLED through the second emission control transistor T6. The driving transistor T1 receives the data signal Dm according to the switching operation of the switching transistor T2 and supplies the driving current Id to the organic emission element OLED.

The gate electrode G2 of the switching transistor T2 is connected to the first scanning line 14. The source electrode S2 of the switching transistor T2 is connected to the data line 16. The drain electrode D2 of the switching transistor T2 is connected to the source electrode S1 of the driving transistor T1 and is connected to the power line 26 through the first emission control transistor T5. The switching transistor T2 performs a switching operation that is turned on according to the first scanning signal Sn received through the first scanning line 14 and supplies the data signal Dm received through the data line 16 to the source electrode S1 of the driving transistor T1.

The gate electrode G3 of the compensation transistor T3 is connected to the first scanning line 14. The source electrode S3 of the compensation transistor T3 is connected to the drain electrode D1 of the driving transistor T1 and is connected to the anode of the organic emission element OLED through the second emission control transistor T6 (refer to a first node NP1). The drain electrode D3 of the compensation transistor T3 is connected to the first electrode C1 of the storage capacitor Cst, the source electrode S4 of the initialization transistor T4, and the gate electrode G1 of the driving transistor T1 (refer to a second node NP2). The compensation transistor T3 is turned on according to the nth scanning signal Sn received through the first scanning line 14 to connect the gate electrode G1 and the drain electrode D1 of the driving transistor T1 to each other in order for the diode connection of the driving transistor T1.

The gate electrode G4 of the initialization transistor T4 is connected to the second scanning line 24. The drain electrode D4 of the initialization transistor T4 is connected to the initialization line 22. The source electrode S4 of the initialization transistor T4 is connected to the first electrode C1 of the storage capacitor Cst, the drain electrode D3 of the compensation transistor T3, and the gate electrode G1 of the driving transistor T1. The initialization transistor T4 is turned on according to the n−1th scanning signal Sn−1 received through the second scanning line 24 and delivers the initialization voltage Vint to the gate electrode G1 of the driving transistor T1 to initialize the voltage of the gate electrode G1 of the driving transistor T1.

The gate electrode G5 of the first emission control transistor T5 is connected to the light-emission line 15. The first emission control transistor T5 may be connected between the power line 26 and the driving transistor T1. The source electrode S5 of the first emission control transistor T5 is connected to the power line 26. The drain electrode D5 of the first emission control transistor T5 is connected to the source electrode S1 of the driving transistor T1 and the drain electrode D2 of the switching transistor T2. As the emission control signal En is applied to the gate electrode G5 of the first emission control transistor T5, the first emission control transistor T5 is turned on so that the driving current Id flows in the organic emission element OLED. The first emission control transistor T5 may determine the timing at which the driving current Id flows into the organic emission element OLED.

The gate electrode G6 of the second emission control transistor T6 is connected to the light-emission line 15. The second emission control transistor T6 may be connected between the driving transistor T1 and the organic emission element OLED. The source electrode S6 of the second emission control transistor T6 is connected to the drain electrode D1 of the driving transistor T1 and the source electrode S3 of the compensation transistor T3. The drain electrode D6 of the second emission control transistor T6 is electrically connected to the anode of the organic emission element OLED. The first emission control transistor T5 and the second emission control transistor T6 are turned on according to the emission control signal En received through the light emission line 15. As the emission control signal En is applied to the gate electrode G6 of the second emission control transistor T6, the second emission control transistor T6 is turned on so that the driving current Id flows in the organic emission element OLED. The second emission control transistor T6 may determine the timing at which the driving current Id flows into the organic emission element OLED.

The gate electrode G7 of the bypass transistor T7 is connected to the third scanning line 34. The source electrode S7 of the bypass transistor T7 is connected to the anode of the organic emission element OLED. The drain electrode D7 of the bypass transistor T7 is connected to the initialization line 22. The bypass transistor T7 is turned on according to the n+1th scanning signal Sn+1 received through the third scanning line 34 to initialize the anode of the organic emission element OLED.

The second electrode C2 of the storage capacitor Cst is connected to the power line 26. The first electrode C1 of the storage capacitor Cst is connected to the gate electrode G1 of the driving transistor T1, the drain electrode D3 of the compensation transistor T3, and the source electrode S4 of the initialization transistor T4.

The cathode of the organic emission element OLED receives the reference voltage ELVSS. The organic emission element OLED receives the driving current Id from the driving transistor T1 and emits light.

In another exemplary embodiment of the invention, the number and connections of the transistors T1 to T7 constituting the pixel PX may be variously changed.

Figure 15:
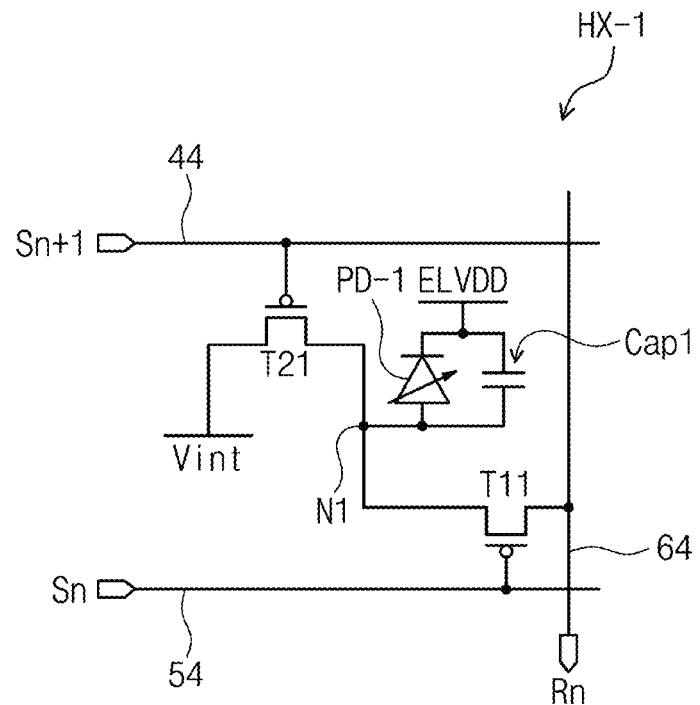
FIGS. 15 to 19 are circuit diagrams showing exemplary embodiments of one photo pixel of FIG. 13 according to the invention.

FIG. 15 is a circuit diagram showing one photo pixel of FIG. 13 according to an exemplary embodiment of the invention.

A photo pixel HX-1 according to an exemplary embodiment of the invention may include photo transistors T11 and T21, a photo capacitor Cant, and a photo sensor PD-1.

The photo transistors T11 and T21 may include a first transistor T11 and a second transistor T21. In an exemplary embodiment of the invention, it is exemplarily shown that each of the first and second transistors T11 and T21 is a p-type transistor. However, the invention is not limited thereto.

The photo pixel HX-1 includes a first scanning line 44 for transmitting the n+1th scanning signal Sn+1, a second scanning line 54 for transmitting the nth scanning signal Sn, and a sensing line 64.

The gate terminal of the first transistor T11 is connected to the second scanning line 54. One terminal of the first transistor T11 is connected to the anode of the photo sensor PD-1 and the other terminal is connected to the sensing line 64.

The gate terminal of the second transistor T21 is connected to the first scanning line 44 and one terminal receives the initialization voltage Vint and the other terminal is connected to the anode of the photo sensor PD-1.

In the exemplary embodiment of FIG. 15, the lower metal layer of the photo sensor PD-1 may be an anode and the upper metal layer may be a cathode. The cathode of the photo sensor PD-1 receives a power voltage ELVDD. One electrode and the other electrode of the photo-capacitor Cap1 are connected to the anode and the cathode of the photo sensor PD-1, respectively.

The first node N1 connected to the anode of the photo sensor PD-1 may be initialized to the initialization voltage Vint before the frame in which the photo sensor PD-1 is driven.

When light is not applied to the photo sensor PD-1, the first node N1 maintains the initialization voltage Vint and the photo capacitor Cap1 charges the charge corresponding to the voltage difference between the power voltage ELVDD and the initialization voltage Vint.

Then, when light is applied to the photo sensor PD-1, as the voltage of the first node N1 approaches the power voltage ELVDD, the charges charged in the photo-capacitor Cap1 are discharged.

When the nth scanning signal Sn is applied to the second scanning line 54 and the first transistor T11 is turned on, a current flows to the sensing line 64 by the charge discharged from the photo capacitor Capt.

Then, when the first transistor T11 is turned off and the n+1th scanning signal Sn+1 is applied and the second transistor T21 is turned on, the anode of the photo sensor PD-1 is initialized by the initialization voltage Vint.

Figure 16:
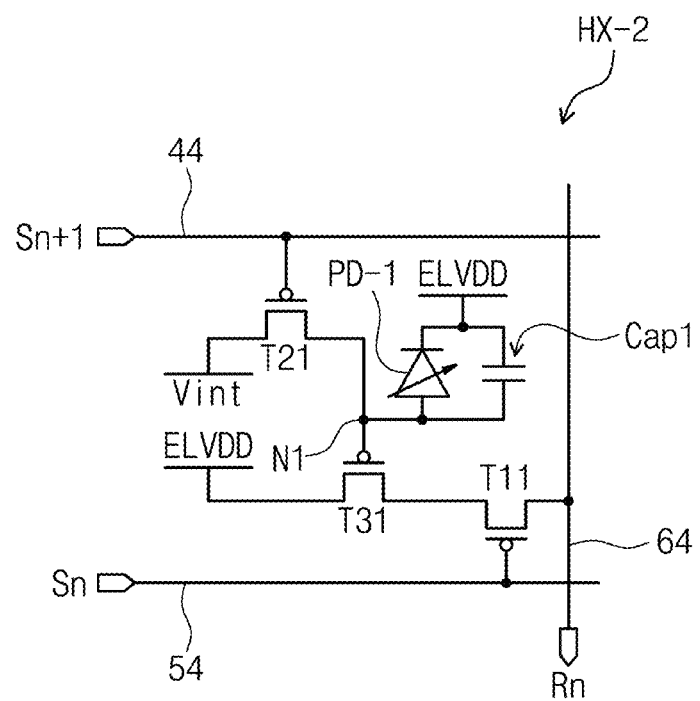

FIG. 16 is a circuit diagram showing one photo pixel of FIG. 13 according to an exemplary embodiment of the invention.

The photo pixel shown in FIG. 16 differs from the photo pixel described with reference to FIG. 15 in the third transistor, and therefore, the third transistor will be mainly described.

The photo pixel HX-2 may further include a third transistor T31. In an exemplary embodiment of the invention, it is exemplarily shown that the third transistor T31 is a p-type transistor. However, the invention is not limited thereto.

The gate terminal of the third transistor T31 is connected to the anode of the photo sensor PD-1. One terminal may receive the power voltage ELVDD, and the other terminal may be connected to one terminal of the first transistor T11.

The third transistor T31 may increase the amount of a current flowing in the sensing line 64 by amplifying the voltage change of the voltage of the first node N1 as light is applied to the photo sensor PD-1.

Figure 17:
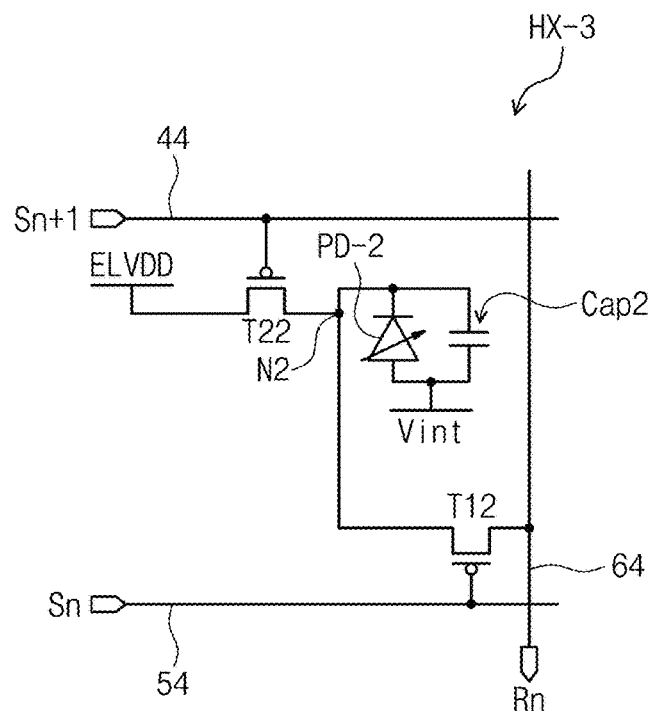

FIG. 17 is a circuit diagram showing one photo pixel of FIG. 13 according to another exemplary embodiment of the invention.

A photo pixel HX-3 shown in FIG. 17 may include photo transistors T12 and T22, a photo capacitor Cap2, and a photo sensor PD-2.

The photo transistors T12 and T22 may include a first transistor T12 and a second transistor T22. In an exemplary embodiment of the invention, it is exemplarily shown that each of the first and second transistors T12 and T22 is a p-type transistor. However, the invention is not limited thereto.

The photo pixel HX-3 includes a first scanning line 44 for transmitting the n+1th scanning signal Sn+1, a second scanning line 54 for transmitting the nth scanning signal Sn, and a sensing line 64.

The gate terminal of the first transistor T12 is connected to the second scanning line 54. One terminal of the first transistor T12 is connected to the cathode of the photo sensor PD-2 and the other terminal is connected to the sensing line 64.

The gate terminal of the second transistor T22 is connected to the first scanning line 44 and one terminal receives the power voltage ELVDD and the other terminal is connected to the cathode of the photo sensor PD-2.

In the exemplary embodiment of FIG. 17, the lower metal layer of the photo sensor PD-2 may be a cathode and the upper metal layer may be an anode. The anode of the photo sensor PD-2 receives the initialization voltage Vint. One electrode and the other electrode of the photo capacitor Cap2 are connected to the anode and the cathode of the photo sensor PD-2, respectively.

The second node N2 connected to the cathode of the photo sensor PD-2 is charged with the power voltage ELVDD before the frame in which the photo sensor PD-1 is driven.

When light is not applied to the photo sensor PD-2, the second node N2 maintains the power voltage ELVDD and the photo capacitor Cap2 charges the charge corresponding to the voltage difference between the power voltage ELVDD and the initialization voltage Vint.

Then, when light is applied to the photo sensor PD-2, the voltage of the second node N2 approaches the initialization voltage Vint.

When the nth scanning signal Sn is applied to the second scanning line 54 and the first transistor T12 is turned on, a current flows to the sensing line 64 by the voltage of the second node N2. When light is incident on the photo sensor PD-2, the amount of a current flowing to the sensing line 64 may be reduced.

Then, when the first transistor T12 is turned off and the n+1th scanning signal Sn+1 is applied and the second transistor T22 is turned on, the cathode of the photo sensor PD-2 is charged with the power voltage ELVDD.

Figure 18:
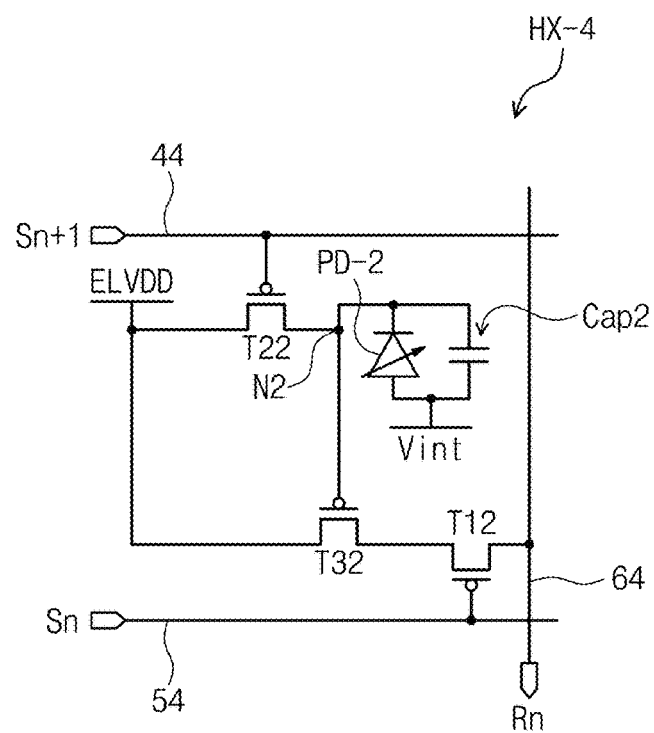

FIG. 18 is a circuit diagram showing one photo pixel of FIG. 13 according to another exemplary embodiment of the invention.

The photo pixel shown in FIG. 18 differs from the photo pixel described with reference to FIG. 17 in the third transistor, and therefore, the third transistor will be mainly described.

The photo pixel HX-4 may further include a third transistor T32. In an exemplary embodiment of the invention, it is exemplarily shown that the third transistor T32 is a p-type transistor. However, the invention is not limited thereto.

The gate terminal of the third transistor T32 is connected to the cathode of the photo sensor PD-2. One terminal may receive the power voltage ELVDD, and the other terminal may be connected to one terminal of the first transistor T12.

The third transistor T32 may increase the amount of a current flowing in the sensing line 64 by amplifying the voltage change of the voltage of the second node N2 as light is applied to the photo sensor PD-2.

Figure 19:
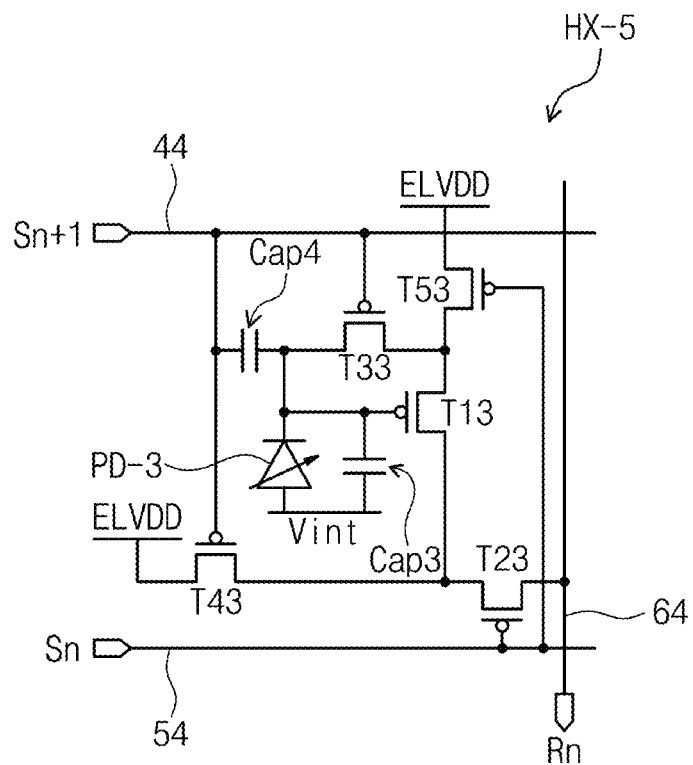

FIG. 19 is a circuit diagram showing one photo pixel of FIG. 13 according to another exemplary embodiment of the invention.

A photo pixel HX-5 shown in FIG. 19 includes photo transistors T13, T23, T33, T43, and T53, a first photo capacitor Cap3, a second photo capacitor Cap4 and a photo sensor PD-3.

The photo transistor may include first to fifth transistors T13, T23, T33, T43, and T53. In an exemplary embodiment of the invention, it is exemplarily shown that each of the first and fifth transistors T13, T23, T33, T43, and T53 is a p-type transistor. However, the invention is not limited thereto.

The photo pixel HX-5 includes a first scanning line 44 for transmitting the n+1th scanning signal Sn+1, a second scanning line 54 for transmitting the nth scanning signal Sn, and a sensing line 64.

The gate terminal of the first transistor T13 is connected to the cathode of the photo sensor PD-3. One terminal of the first transistor T13 is connected to the other terminal of the fifth transistor T53 and the other terminal of the first transistor T13 is connected to one terminal of the second transistor T23.

The gate terminal of the second transistor T23 is connected to the second scanning line 54. One terminal of the second transistor T23 is connected to the other terminal of the first transistor T13 and the other terminal of the second transistor T23 is connected to the sensing line 64.

The gate terminal of the third transistor T33 is connected to the first scanning line 44. One terminal of the third transistor T33 is connected to one electrode of the second photo capacitor Cap4 and the cathode of the photo sensor PD-5, and the other terminal is connected to one terminal of the first transistor T13.

The gate terminal of the fourth transistor T43 is connected to the first scanning line 44 and one terminal receives the power voltage ELVDD and the other terminal is connected to the one terminal of the second transistor T23.

The gate terminal of the fifth transistor T53 is connected to the second scanning line 54 and one terminal receives the power voltage ELVDD and the other terminal is connected to the one terminal of the first transistor T13.

One electrode of the second photo cathode Cap4 is connected to the first scanning line 44 and the other electrode is connected to the cathode of the photo sensor PD-3.

One electrode and the other electrode of the first photo capacitor Cap3 are connected to the anode and the cathode of the photo sensor PD-3, respectively.

Figure 20:
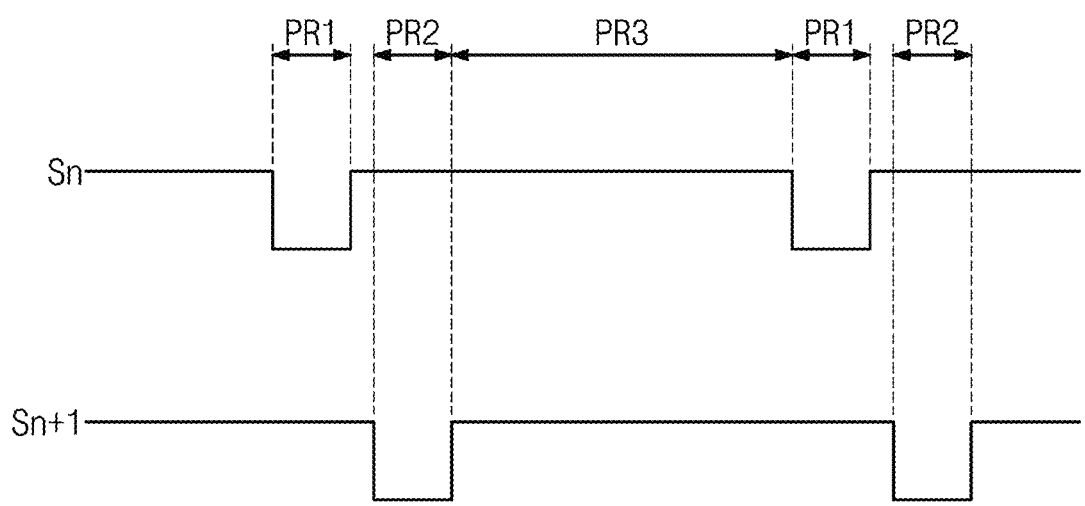
FIG. 20 is a waveform diagram of a signal applied to FIG. 19, and FIGS. 21A to 21C are diagrams for explaining a driving mechanism of a photo pixel for each section.

FIG. 20 is a waveform diagram of a signal applied to FIG. 19, and FIGS. 21A to 21C are diagrams for explaining a driving mechanism of a photo pixel for each section.

Figure 21A:
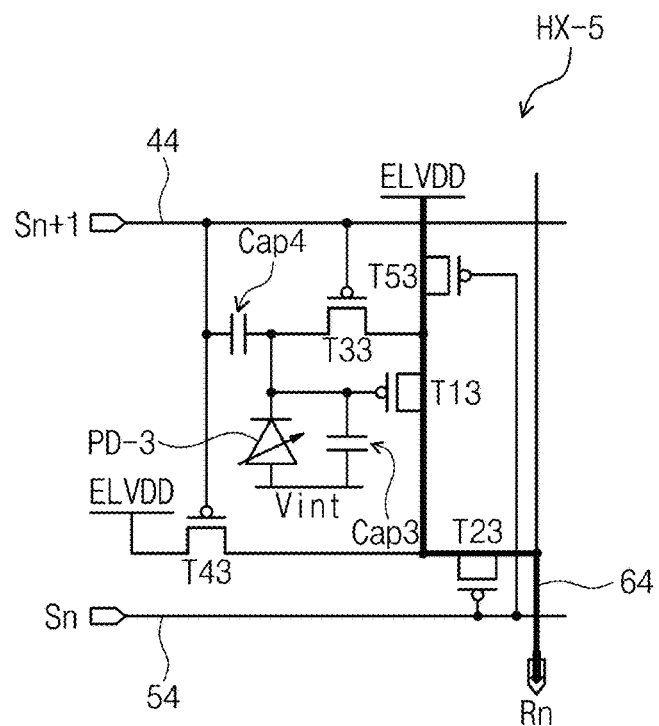

Referring to FIGS. 20 and 21A, the second transistor T23 and the fifth transistor T53 are turned on during the first section PR1 in which the nth scanning signal Sn is activated.

If light is applied to the photo sensor PD-3 before the first section PR1, the gate voltage of the first transistor T13 is lowered by the photo sensor PD-3, and as the first transistor T13 operates, a current Rn flows through the sensing line 64 during the first section PR1.

Figure 21B:
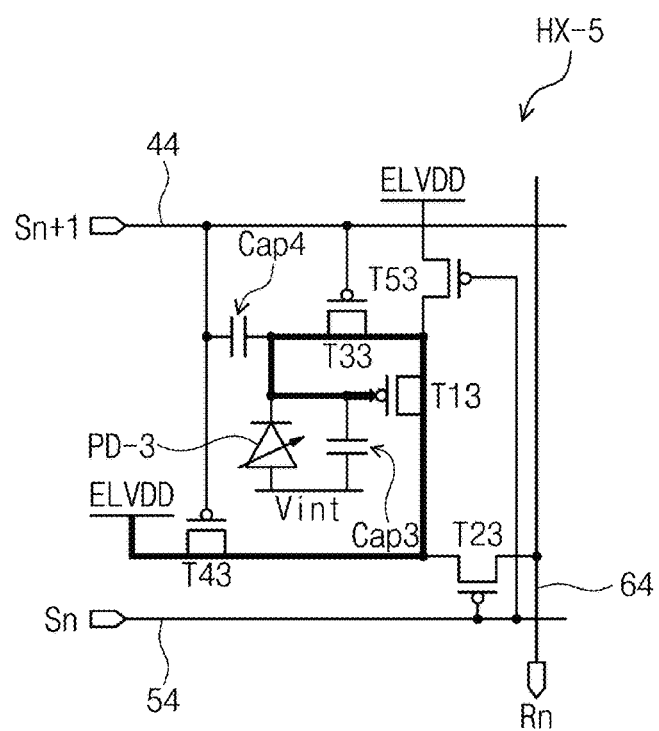

Referring to FIGS. 20 and 21B, the third transistor T33 and the fourth transistor T43 are turned on during the second section PR2 in which the n+1th scanning signal Sn+1 is activated. The power voltage ELVDD is transmitted to the gate terminal of the first transistor T13 through a path that sequentially passes through the fourth transistor T43, the first transistor T13, and the third transistor T33, and the first transistor T13 is turned off as the gate terminal voltage of the transistor T13 increases. As the first transistor T13 is turned off during the second section PR2, the voltage for compensating the threshold voltage of the first transistor T13 is stored in the gate terminal of the first transistor T13.

Figure 21C:
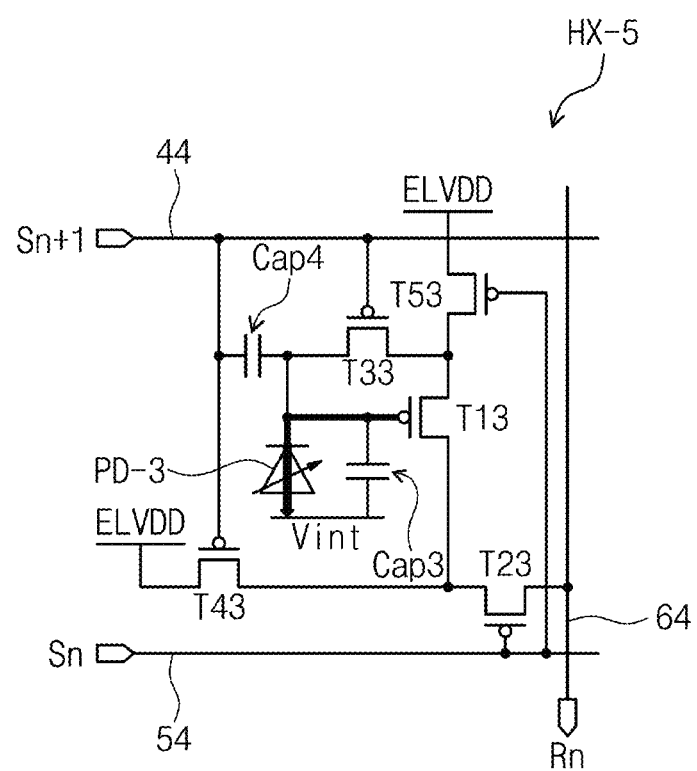

Referring to FIGS. 20 and 21C, the photo sensor PD-3 receives light during the third section PR3 until the nth scanning signal Sn is activated again. When light is applied to the photo sensor PD-3 during the third period PR3, the voltage of the gate terminal of the first transistor T13 becomes close to the initialization voltage Vint.

According to an exemplary embodiment of the invention, by adding the operation of compensating the threshold voltage of the first transistor T13 using signals (the nth scanning signal and the n+1th scanning signal) for driving the pixels, the non-uniformity issue of sensing sensitivity due to the threshold voltage dispersion of the transistor T13 may be solved.

In a display device according to an exemplary embodiment of the invention, the display device has a photo pixel built in a driving layer of a display panel to improve sensing sensitivity.

According to a display device according to an exemplary embodiment of the invention, even though photo pixel areas are provided in a light sensing area, the arrangement structure of display elements may not be changed. Therefore, the display device may maintain the resolution within the display area constant regardless of the area.

Although the exemplary embodiments of the invention have been described, it is understood that the invention should not be limited to these exemplary embodiments but various changes and modifications may be made by one ordinary skilled in the art within the spirit and scope of the invention as hereinafter claimed.

What is claimed is:

1. A display device comprising:
a substrate;
a driving layer disposed on the substrate, and comprising:
first driving circuit groups each comprising N first pixel driving circuits and photo pixels, and
second driving circuit groups each comprising N second pixel driving circuits spaced apart from the first driving circuit groups in a first direction, wherein N is a natural number and each of the photo pixels comprises a photo driving circuit and a photo sensor electrically connected to the photo driving circuit; and
a display element layer disposed on the driving layer, and comprising first display element groups each comprising N first display elements electrically connected to the respective N first pixel driving circuits through N first contact holes, respectively, and second display element groups each comprising N second display elements electrically connected to the N second pixel driving circuits through N second contact holes,
wherein a minimum distance measured in a first predetermined direction between first color display elements included in the plurality of first display elements in a plan view and a minimum distance measured in a second predetermined direction orthogonal to the first predetermined direction between first color display elements included in the plurality of first display elements in the plan view are substantially the same,
wherein a distance between two first pixel driving circuits of the N first pixel driving circuits adjacent to each other in a second direction which is identical to or different from the first predetermined direction and different from the first direction with a photo pixel of the photo pixels therebetween in the plan view is different from a distance between two first pixel driving circuits of the N first pixel driving circuits continuously disposed in the second direction, and
wherein a distance between first contact holes of the N first contact holes respectively corresponding to directly adjacent first pixel driving circuits of the N first pixel driving circuits is smaller than a distance between adjacent second contact holes of the N second contact holes respectively corresponding to directly adjacent second pixel driving circuits of the N second pixel driving circuits, in the second direction.

2. The display device of claim 1,
wherein minimum distances between first color display elements included in the plurality of second display elements, which are measured in the first predetermined direction in the plan view, are substantially the same,
wherein distances between adjacent two second pixel driving circuits of the N second pixel driving circuits, which are measured in the first direction in the plan view, are substantially the same.

3. The display device of claim 2, wherein a display area where an image is displayed and a non-display area adjacent to the display area are defined on the display device,
wherein the display area comprises a normal display area and a light sensing area for sensing a user's input by an incident light,
wherein the first driving circuit groups and the first display element groups are disposed in the light sensing area in the plan view,
wherein the second driving circuit groups and the second display element groups are disposed in the normal display area in the plan view.

4. The display device of claim 3, wherein an area which each of the first driving circuit groups occupies and an area which each of the second driving circuit groups occupies are substantially the same, wherein an area which each of the first display element groups occupies and an area which each of the second display element groups occupies are substantially the same.

5. The display device of claim 3, wherein an area which each of the N first pixel driving circuits is smaller than an area which each of the N second pixel driving circuits occupies.

6. The display device of claim 3, wherein a first driving circuit group among the first driving circuit groups and a second driving circuit group among the second driving circuit groups adjacent to the first driving circuit group in a second direction crossing the first direction are spaced apart from each other to define a vacant area.

7. The display device of claim 6, wherein a distance between a first pixel driving circuit of the first driving circuit group in the second direction and a second pixel driving circuit of the second driving circuit group adjacent to each other is greater than a distance between two first pixel driving circuits of the N first pixel driving circuits included in the respective first driving circuit groups and adjacent to each other in the second direction and a distance between two second pixel driving circuits of the N second pixel driving circuits included in the respective second driving circuit groups and adjacent to each other in the second direction.

8. The display device of claim 6, wherein the driving layer further comprises signal lines,
wherein a predetermined number of the signal lines has a bent shape in the vacant area.

9. The display device of claim 8, wherein a predetermined number of the signal lines is branched in the vacant area to be electrically connected to the N first pixel driving circuits and the photo driving circuit.

10. The display device of claim 1, wherein the photo sensor comprises:
a lower metal layer disposed on the substrate;
an active layer disposed on the lower metal layer;
an upper metal layer which is disposed on the active layer and in which an opening exposing a portion of the active layer is defined;
an absorption filter which is disposed on the upper metal layer and covers the opening; and
an interference filter which is disposed on the upper metal layer and covers the opening.

11. The display device of claim 1, wherein the display element layer comprises:
a pixel definition film which overlaps the photo sensor; and
a lens which overlaps the photo sensor on the pixel definition film and includes a same material as that of the pixel definition film.

12. The display device of claim 1, wherein a display area where an image is displayed and a non-display area adjacent to the display area are defined on the display device,
wherein the non-display area comprises a first bending area defined outside a first side of the display area in the first direction, a first pad area defined outside the first bending area in the first direction, a second bending area defined outside a second side of the display area in the second direction, and a second pad area defined outside the second bending area in the first direction,
wherein the substrate is bent along a bending axis extending in the second direction intersecting the first direction in the first and second bending areas, further comprising:
a first driving circuit chip which provides a signal to the N first pixel driving circuits and the photo driving circuit and is disposed on the first pad area; and
a second driving circuit chip which receives a signal sensed by the photo pixel and is disposed in the second pad area.

13. The display device of claim 12, further comprising a flexible printed circuit substrate which connects the first pad area and the second pad area of the display device to each other.

14. A display device comprising:
a substrate;
a driving layer disposed on the substrate, and comprising first driving circuit groups each comprising a plurality of first pixel driving circuits and photo pixels and second driving circuit groups each comprising a plurality of second pixel driving circuits, wherein the first driving circuit groups and the second driving circuit groups are spaced apart from each other in a first direction; and
a display element layer disposed on the driving layer, and comprising a plurality of first display elements electrically connected to the plurality of first pixel driving circuits through a plurality of first contact holes, respectively, and a plurality of second display elements electrically connected to the plurality of second pixel driving circuits through a plurality of second contact holes, respectively,
wherein a minimum distance measured in a first predetermined direction between first color display elements included in the plurality of display elements in a plan view and a minimum distance measured in a second predetermined direction orthogonal to the first predetermined direction between first color display elements included in the plurality of first display elements in the plan view are substantially the same,
wherein a first driving circuit group among the first driving circuit groups and a second driving circuit group among the second driving circuit groups adjacent to the first driving circuit group in a second direction different from the first direction are spaced apart from each other, and wherein a distance between adjacent first contact holes of the plurality of first contact holes respectively corresponding to directly adjacent first pixel driving circuits of the N first pixel driving circuits is smaller than a distance between adjacent second contact holes of the plurality of second contact holes respectively corresponding to directly adjacent second pixel driving circuits of the N second pixel driving circuits, in the second direction.

15. The display device of claim 14, wherein a distance between a first pixel driving circuit of the first driving circuit group adjacent to each other in the first direction and a second pixel driving circuit of the second driving circuit group is greater than a distance between two first pixel driving circuits of the plurality of first pixel driving circuits included in the respective first driving circuit groups and adjacent to each other in the first direction and a distance between two second pixel driving circuits of the plurality of second pixel driving circuits included in the respective second driving circuit groups and adjacent to each other in the first direction.

* * * * *